United States Patent
Ikuno et al.

(10) Patent No.: US 7,333,276 B2
(45) Date of Patent: Feb. 19, 2008

(54) OPTICAL ELEMENT AND LIGHTING DEVICE PROVIDED THEREWITH

(75) Inventors: Keiko Ikuno, Sakai (JP); Kenji Konno, Sakai (JP)

(73) Assignee: Konica Minolta Opto, Inc., Hachioji-Shi (JP)

( * ) Notice: Subject to any disclaimer, the term of this patent is extended or adjusted under 35 U.S.C. 154(b) by 0 days.

(21) Appl. No.: 11/500,624

(22) Filed: Aug. 8, 2006

(65) Prior Publication Data

US 2007/0041210 A1 Feb. 22, 2007

(30) Foreign Application Priority Data

Aug. 8, 2005 (JP) ............... 2005-228995
Apr. 21, 2006 (JP) ............... 2006-118047

(51) Int. Cl.
*G02B 27/02* (2006.01)
*G02B 17/00* (2006.01)
*F21V 7/00* (2006.01)
*F21V 5/00* (2006.01)
*F21V 5/04* (2006.01)

(52) U.S. Cl. ............ 359/800; 359/727; 362/299; 362/327; 362/335

(58) Field of Classification Search ........... 359/718, 359/727, 737, 799, 800; 362/296, 299, 326, 362/327, 335, 341, 349, 350
See application file for complete search history.

(56) References Cited

U.S. PATENT DOCUMENTS 5,042,928 A * 8/1991 Richards .................. 359/728
5,343,330 A * 8/1994 Hoffman et al. ............ 359/708
6,536,923 B1 * 3/2003 Merz ........................ 362/327
6,607,286 B2 * 8/2003 West et al. ................ 362/255
7,181,378 B2 * 2/2007 Benitez et al. ............... 703/2
7,222,995 B1 * 5/2007 Bayat et al. ................ 362/327
7,244,924 B2 * 7/2007 Kiyomoto et al. .......... 250/216

FOREIGN PATENT DOCUMENTS

| JP | 4-36588 B2 | 6/1992 |
| JP | 6-28725 Y2 | 8/1994 |
| JP | 9-167515 A | 6/1997 |
| JP | 2002-228921 A | 8/2002 |
| JP | 2004-516684 A | 6/2004 |
| JP | 2005-174693 A | 6/2005 |

* cited by examiner

*Primary Examiner*—David N. Spector
(74) *Attorney, Agent, or Firm*—Sidley Austin LLP

(57) ABSTRACT

An optical element that condenses light emitted from a light source has: an entrance surface where the light enters; an exit surface from which the light entering inside via the entrance surface; and a reflection surface that directs, to the exit surface by total reflection, part of the light entering the inside via the entrance surface. The reflection surface has an axis of symmetry of sixfold or higher-order-fold rotation. The optical element fulfills conditional formula: 0.3<a/b<1.4, where a denotes the maximum length of the exit surface in the direction perpendicular to the axis of symmetry; and b denotes a surface gap on the axis of symmetry between the entrance surface and the exit surface. As a result, an optical element can be provided which achieves highly efficient condensation at low costs and with simple configuration and also which achieves compactification by reducing the diameter of the optical element for the size of the light emitting surface.

20 Claims, 22 Drawing Sheets

US 7,333,276 B2

OPTICAL ELEMENT AND LIGHTING DEVICE PROVIDED THEREWITH

This application is based on Japanese Patent Application No. 2005-228995 filed on Aug. 8, 2005 and Japanese Patent Application No. 2006-118047 filed on Apr. 21, 2006, the contents of which are hereby incorporated by reference.

BACKGROUND OF THE INVENTION

1. Field of the Invention

The present invention relates to an optical element suitable for a light source (light-emitting element), such as a light-emitting diode or the like, and a lighting device provided with such an optical element, and more specifically to an optical element suitable for improving the directivity of light (a ray of light) emitted from a light-emitting element and a lighting device provided with such an optical element.

2. Description of the Prior Art

In recent years, with an increase in the power of a semiconductor light-emitting element (solid-state light-emitting element), such as a light-emitting diode (LED) or the like, application of the solid-state light-emitting element to the illumination field has been rapidly advanced. The solid-state light-emitting element converts electric energy directly into light energy, having features of higher efficiency and less heat generation upon light emission than an incandescent lamp and a fluorescent lamp. However, the solid-state light-emitting element has a large angle of divergence of light emitted from the light emitting surface, thus leading to an enormous lens size, when used in a conventional optical system, in attempt to achieve condensation with low loss.

Thus, conventionally, various suggestions have been given with a view to condensing an emitted ray of light with low loss. Then, one of such suggestions relates to configuration of an optical element provided, around or above a light source such as a light emitting diode or the like having wide exit angle distribution, as means for adjusting the exit angle distribution of the light source.

For example, patent document 1 discloses an optical element that transmits, concentrically as viewed from the front, a ray of light emitted from a light source by a reflection surface of an inverted conic shape. This configuration permits providing a lens for a light-emitting element which is excellent in the visibility not only from close distance but also from great distance and which is also excellent in the viewing angle characteristics.

More specifically, the lens for a light-emitting element described above is formed into an inverted circular conic shape. When the light-emitting element is disposed at a light-emitting element fitting part that is formed at the bottom of the lens body, light emitted from this light-emitting element is totally reflected on the peripheral wall of the lens body and radiated forward. On the peripheral wall, a corner is circumferentially provided (formed in the circumferential direction) at one area or a plurality of areas. The corner described above is formed by changing the angle between the peripheral wall described above and the central axis of the lens body from the bottom described above to the front surface of the lens. Circumferentially providing such a corner at one area or a plurality of areas causes light from the light emitting element described above to be scattered forward at the aforementioned corner and radiated concentrically as viewed from the front of the lens.

Moreover, patent document 2 discloses an optical element that changes the direction of a ray of light emitted from a light source by using a refracting surface and a total reflection surface. This optical element controls the viewing angle of light generated by a light-emitting diode (LED).

More specifically, the configuration is as follows. A peripheral optical element as the optical element described above efficiently collects light from the LED and generates high light intensity within a limited, narrow, predetermined viewing angle with respect to the optic axis. The LED is centered in this peripheral optical element with the refracting surface directing light toward the peripheral optical element. The light is totally reflected inside by the reflection surface and then exits from the peripheral optical element through an exit surface. The viewing angle is determined in correspondence with the angles of the refracting surface and the reflection surface with respect to the optic axis.

Patent document 3 discloses an optical element that controls a ray of light emitted from a light source by using a bulk-type lens having a side surface as a total reflection surface. With this configuration, the optical element can be used for semiconductor light sources, such as an LED and the like, thus permitting convergence, divergence, collimation, and the like of all of light emitted by these light sources, and also permitting providing an extremely low-cost lens.

More specifically, the bulk lens described above is formed of an optical medium having (i) an apex, (ii) a bottom, (iii) an outer periphery, (iv) a concave part which is composed of a ceiling and an inner periphery, and which is formed from the bottom toward the apex. The concave part functions as a storage part for the light source or a light detector, the ceiling and the apex function as a lens surface, the inner periphery functions as a light entrance surface, the outer periphery functions as a total reflection surface, and the bottom functions as a reflection surface.

Patent document 4 discloses an optical element employing total reflection and refraction and having an exit surface divided into two regions including a flat surface portion and a lens portion. With this configuration, of light exiting radially from the LED chip position, the light at the outer periphery and the light at the center are transformed into parallel rays that travel forward by reflection on a paraboloid of revolution and by primary refraction, respectively. As a result, the light emitted is effectively used, thus achieving high efficiency.

More specifically, the center of the bottom cut surface of the parabolic rotary body serves as a LED chip fitting position. Moreover, formed on this cut surface is a concave portion of a substantially hemispheric shape with its center lying at the LED chip fitting position. On the other hand, on the center of the front surface of the parabolic rotary body, a ring-shaped groove is formed which has a convex portion so formed as to be convexed forward for primary refraction. With this groove, the outer front surface is formed into a planar shape with transparent resin.

Patent document 5 suggests an optical element which has a peripheral side surface of a spheroidal shape and which improves the directivity of a ray of light from a light emitting element by total reflection on the peripheral side surface. FIG. 24 is a sectional view showing the general configuration of the optical element described above. This optical element has a peripheral side surface 101 that is bowl-shaped, and has near the apex thereof a concave portion 102.

With this configuration, of rays of light emitted from the light-emitting element stored in the concave portion 102, those entering a side surface 102a of the concave portion 102 are primarily refracted at this position, totally reflected on the peripheral side surface 101, and then exits forward in parallel to the optical axis. On the other hand, those entering a top surface 102b of the concave portion 102 are refracted by a parabolic curved surface of the top surface 102b, and exits forward to the front surface as rays of light in parallel to the optical axis. This results in higher light use efficiency, thus permitting an increase in the luminance.

Patent document 6 suggests an optical element so formed as to have the side surface 102a of the concave portion 102 of FIG. 24 provided with curvature. This configuration, compared to the configuration of FIG. 24, seems to further improve the directivity of a ray of light from a light-emitting element.

Patent documents 1 to 6 are as follows:
[Patent document 1] JP-A-2005-174693
[Patent document 2] JP-A-H9-167515
[Patent document 3] JP-A-2002-228921
[Patent document 4] Japanese Utility Model Publication No. H 6-28725
[Patent document 5] Japanese Patent Publication No. H4-36588
[Patent document 6] Number of Published Japanese Translation of a PCT Application 2004-516684.

However, configuration as described in the patent documents above requires the following improvements.

Specifically, patent document 1 is targeted on a light source which is too small for the optical element. Thus, in order to provide the same effect even in a case of a light source with some width, such as the case with a surface light source, the size of this light source needs to be considered, thus resulting in the need for a very large optical element.

In patent document 2, which employs refraction and total reflection to change the direction of a ray of light from the light source, light emitted from the light source reaches the total reflection surface after passing through the refracting surface, which results in complicated configuration.

In patent document 3, which employs the bulk-type lens in order to increase rays of light emitted forward of the light source, the size of the lens is impractically very large when a surface light source with a large diameter is used as a light source.

In patent document 4, in which the exit side surface of the optical element has very complicated configuration, the degree of difficulty in manufacturing is great, thus disadvantageously leading to cost increase and lower efficiency.

With the configuration of the optical elements of patent document 5 and 6, it is assumed that, in order to refract rays of light entering the top surface 102b of the concave portion 102 shown in FIG. 24 to thereby improve the directivity thereof, the maximum diagonal length of the top surface 102b (maximum length perpendicular to the optical axis) needs to be at least twice the diagonal length of the light-emitting surface of the light-emitting element. Therefore, an increase in the area of the light-emitting surface of the light-emitting element requires an increase in the maximum diagonal length of the top surface 102b, thus resulting in an increase in the diameter of the optical element, which fails to provide a compact optical element.

In addition, the rays of light entering the side surface 102a of the concave portion 102 forms a larger angle with respect to the optical axis as a result of refraction on the side surface 102a. To subject the rays of light refracted on the side surface 102a to total reflection on the peripheral side surface 101 in this condition, the angle of incidence of the ray of light onto the peripheral side surface 101 needs to be larger than the total reflection angle. This requires a large inclination of the peripheral side surface 101 with respect to the optical axis, thus resulting in a large diameter of the optical element, which leads to failure to achieve compact configuration of the optical element.

In conclusion, the configuration of the optical elements suggested in patent documents 1 to 6 suffer, in efficiently condensing the light-emitting element (improving the directivity of a ray of light emitted from the light-emitting element), from: a problem of complicated form of the optical element, which leads to cost increase; and a problem of a large diameter of the optical element with respect to the size of the light emitting surface of the light-emitting element, which results in insufficient compactification.

SUMMARY OF THE INVENTION

In view of the problems described above, the present invention has been made, and it is an object of the invention to provide an optical element which can achieve efficient condensation at low costs and with simple configuration and also can achieve compactification with a small diameter of the optical element with respect to the size of a light emitting surface, and to a lighting device including this optical element.

To achieve the object described above, according to one aspect of the invention, an optical element that condenses light emitted from a light source includes: an entrance surface where the light enters; an exit surface from which the light entering inside via the entrance surface exits; and a reflection surface that directs, to the exit surface by total reflection, part of the light entering the inside via the entrance surface. The reflection surface has an axis of symmetry of sixfold or higher-order-fold rotation. Conditional formula below is fulfilled:

$$0.3 < a/b < 1.4,$$

where
    a denotes the maximum length of the exit surface in the direction perpendicular to the axis of symmetry; and
    b denotes a surface gap on the axis of symmetry between the entrance surface and the exit surface.

According to another aspect of the invention, an optical element that condenses in a predetermined direction light emitted from a light source having a widening surface form, includes: an entrance surface formed of a flat surface; an exit surface from which light entering via the entrance surface exits, the exit surface being so formed as to be convexed on the exit side of the light; and a reflection surface which directs, to the exit surface by total reflection, part of the light entering via the entrance surface, the reflection surface being so formed as to be convexed on the entrance side of the light. The light source is disposed near the entrance surface. After entering the entrance surface, light emitted from the light source is totally reflected by the convexed portion of the reflection surface, is further transmitted through the exit surface, and exits therefrom, or after entering the entrance surface, is directly transmitted through the exit surface and exits therefrom. Conditional formula below is fulfilled:

$$1.0 < r/(n-n')TL < 6.0,$$

where
    r denotes the radius of curvature of the exit surface;
    n denotes the refractive index of the optical element;
    n' denotes the refractive index of a medium on the exit side; and
    TL denotes the full length of the optical element.

According to still another aspect of the invention, a lighting device includes: the optical element described above; and a light source that is arranged near an entrance surface of the optical element. The light source described above may have a widening surface form or may be a point light source.

BRIEF DESCRIPTION OF THE DRAWINGS

The objects and features described above and other objects and features of the present invention will be clarified by description given below concerning preferred examples and also with reference to the accompanying drawings

DETAILED DESCRIPTION OF THE PREFERRED EMBODIMENTS

First Embodiment

Figure 1:
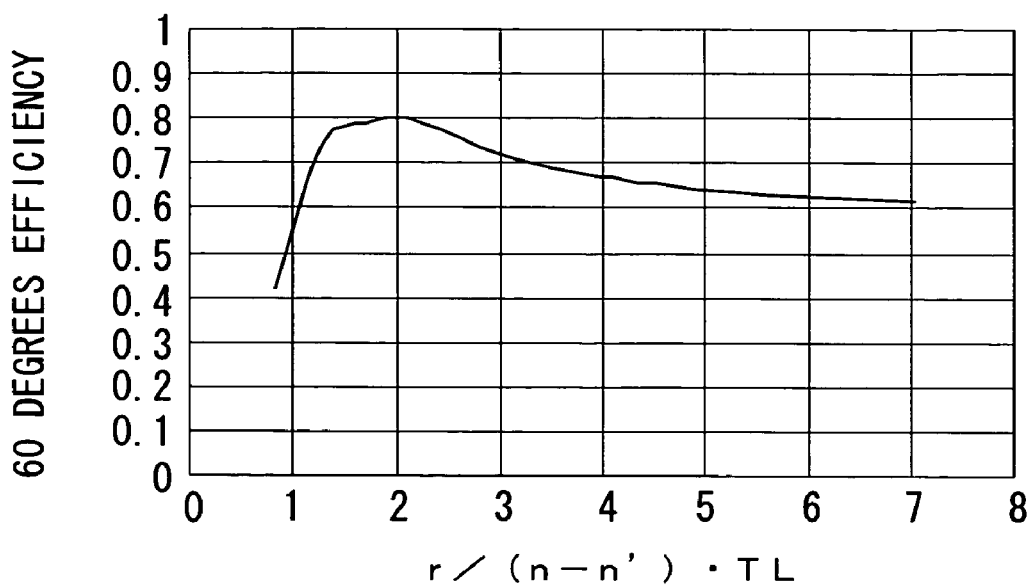
FIG. 1 is a graph showing change in 60 degrees efficiency with various values substituted in conditional formula 1 according to one embodiment of the invention.

Hereinafter, one embodiment of the present invention will be described with reference to the accompanying drawings. The invention refers to an optical element which condenses in a predetermined direction light emitted from a light source having a widening surface form. This optical element has a first surface, a second surface, and a third surface. The first surface is an entrance surface formed of a flat surface where light emitted from the light source enters. The third surface is an exit surface from which light entering via the first surface exits and which is so formed as to be convexed on the light exit side. The second surface is a reflection surface which directs, to the third surface by total reflection, part of light entering via the first surface and which is so formed as to be convexed on the light entrance side. With the first surface disposed near the light source, light exiting from the light source enters the first surface, is totally reflected by the convexed portion of the second surface, and is further transmitted through the third surface and then exits therefrom, or the light, after entering the first surface, is directly transmitted through the third surface and then exits therefrom.

The optical element fulfills conditional formula 1 below:

$$1.0 < r/(n-n')TL < 6.0 \qquad (1),$$

where r denotes the radius of curvature of the third surface;

n denotes the refractive index of the optical element;

n' denotes the refractive index of the medium on the exit side; and

TL denotes the full length of the optical element.

According to this configuration, all of light emitted from the surface light source can enter the optical element and many components thereof can be totally reflected by the second surface. Consequently, more components, after transmitted to the optical element, can exit at an exit angle within a specified range with respect to the optical axis, thus permitting achieving high efficiency. The light not reflected by the second surface but traveling directly toward the third surface is refracted at this area to be thereby advantageously provided with directivity.

As described above, employing the total reflection does not require a reflection coating that is used for a normal reflection surface, thus achieving cost reduction, and also permits control of not only this reflection surface but also the angle of a ray of light directly entering the third surface, thus achieving very high efficiency. Moreover, the first surface and the second surface are formed of a flat surface and a convex surface in combination. In this case, compared to a case where only a flat surface part is provided or a case where only a convex surface part is provided, the degree of difficulty in machining is high, but machining can be advantageously achieved with relative ease, compared to configuration such that a portion surrounding the center of the convexed part is concaved. Besides, all of light from the light source is transmitted through the third surface, which is continuously shaped and thus easy to manufacture. Note that the third surface may be a fresnel lens.

The invention achieves high efficiency in the condensation characteristic by optimally designing both the optical path of a ray of light totally reflected by the second surface and the optical path of a ray of light directly entering the third surface. The conditional formula 1 described above indicates the range of such optimum design. To describe it more specifically, the conditional formula 1 sets the range of the ratio between the focal length of the third surface and the full length of the optical element, defining action of a ray of light on the third surface.

Fulfilling the conditional formula 1 results in a small-sized optical element having favorable efficiency. That is, if the value $r/(n-n')$ TL is over the upper limit of the conditional formula 1, the degree of condensation on the third surface is so strong as to largely bend rays of light reflected on the reflection surface (second surface), which disadvantageously results in a deterioration in the degree of condensation. On the contrary, if the value $r/(n-n')$ TL is below the lower limit of the conditional formula 1, rays of light directly entering the third surface cannot be condensed, which disadvantageously results in difficulty in achieving high efficiency.

FIG. 1 is a graph showing change in the ratio of energy (60 degrees efficiency) falling within a whole angle of 60 degrees with various values substituted in the conditional formula 1. This figure shows the results of simulation done under the condition that the light source is a surface light source having uniform luminance, with the angle characteristic exhibiting Lambert' distribution. As can be seen from this figure, if the value $r/(n-n')$ TL is below the lower limit of the conditional formula 1, the efficiency disadvantageously and rapidly deteriorates. On the contrary, if the value $r/(n-n')$ TL is over the upper limit of the conditional formula 1, a change in the efficiency is small but the value TL as the full length of the optical element increases, which disadvantageously results in upsizing of the entire element. As can be read from this figure, even more preferable conditional range is as shown in conditional formula 1' below:

$$1.2 < r/(n-n')TL < 3.5 \quad (1').$$

In the invention, the second surface is an aspherical surface, which is so formed as to be increasingly convexed toward the periphery from the optical axis and which fulfills conditional formula below:

$$-1.2 < k < -0.8 \quad (2),$$

where
k denotes the conic coefficient.

It is more preferable that the second surface fulfill $-1.1 < k < -0.9$, and it is the most preferable that the second surface be a paraboloidal surface where k is equal to $-1$.

According to this configuration, the exit angle of a ray of light after transmitted to the optical element can be specified in detail. As represented by an ellipsoidal surface and a paraboloidal surface, shaping the aspherical surface increasingly convexed toward the periphery permits light emitted from the center of the surface light source in particular to be efficiently condensed and collimated. On the contrary, shaping the aspherical surface less convexed results in larger distribution of exit angles of rays of light from the reflection surface, which in turn disadvantageously results in deterioration in the degree of condensation.

Further, it is preferable that the aspherical surface be formed into a shape close to a paraboloidal shape and fulfill conditional formula 2 above. In addition, the same effect is provided by fulfilling the conditional formula 2 through expansion of the aspherical coefficient even without use of a conic coefficient in its design, which will be described below.

A normal aspherical surface is represented as follows:

$$Z = ch^2/[1+\sqrt{1-(1+k)c^2h^2}] + Ah^4 + Bh^6 + Ch^8 + Dh^{10}\ldots,$$

where
Z denotes an aspherical shape (distance from the apex of an aspherical surface along the optical axis);
H denotes the distance from the optical axis;
c denotes the paraxial curvature;
k denotes the conic coefficient; and
A, B, C, D . . . denote aspherical coefficients.

In a case where, in particular, the aspherical coefficient is zero, the aspherical surface is represented as follows, being called a conic surface:

$$Z = ch^2/[1+\sqrt{1-(1+k)c^2h^2}].$$

The conic surface can be represented by the aspherical coefficient described above, and this exploration can be achieved as follows where k is equal to 0:

$$Z = ch^2/\{1+\sqrt{(1-c^2h^2)}\} - (1/8)kc^3h^4 + (1/16)k^2c^5h^6 - (5/128)k^3c^7h^8 + (7/256)k^4c^9h^{10}\ldots$$

Therefore, even if the shape of the second surface is represented by an aspherical coefficient only where the conic coefficient is equal to zero, or a different expression, such as spline or the like, as long as the shape is close to a conic surface and the conic coefficient falls within the range of the conditional formula 2, these expressions can be considered to be substantially equal to each other.

Moreover, in the invention, conditional formula 3 below is fulfilled:

$$1.8 < B/D < 6.0 \quad (3),$$

where
B denotes the maximum length of the exit surface in the direction perpendicular to the optical axis (diameter of the optical element); and
D denotes the maximum diagonal length of the light source (the size of the light source, the maximum length of the light source in the length direction perpendicular to the optical axis, the diameter of the light source).

According to this configuration, optimally setting the optical element with respect to the size of the light source permits achieving a compact lighting device with high efficiency. The diameter of the optical element approximately equal to the size of the light source results in difficulty in condensation and thus lower efficiency. On the other hand, a too large diameter of the optical element with respect to the size of the light source results in failure to achieve compactness as a whole.

Figure 2:
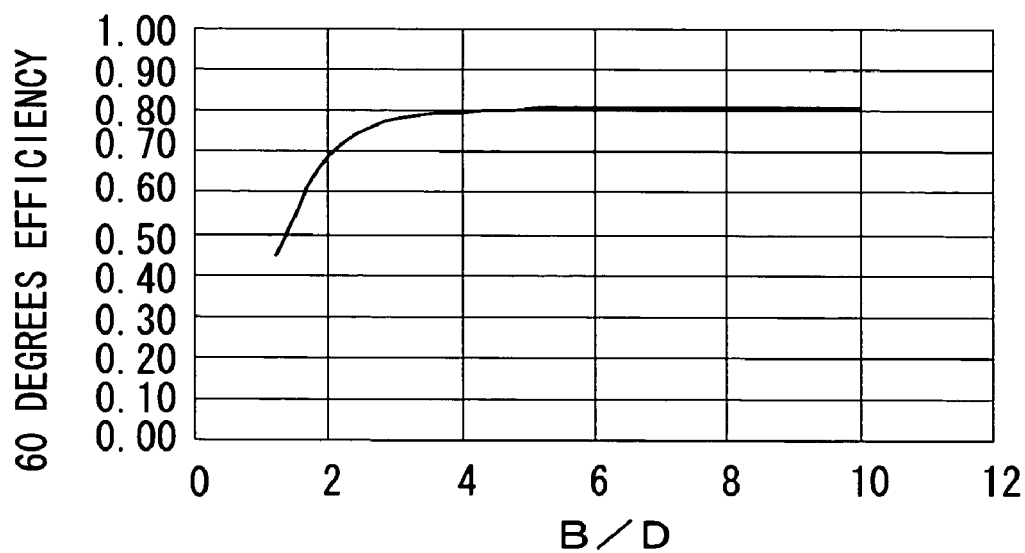
FIG. 2 is a graph showing change in 60 degrees efficiency with various values substituted in conditional formula 3.

FIG. 2 is a graph showing change in the ratio of energy (60 degrees efficiency) falling within a whole angle of 60 degrees with various values substituted in the conditional formula 3. This figure shows the results of simulation done under the condition that the light source is a surface light source having uniform luminance, with the angle characteristic exhibiting Lambert' distribution. As can be seen from this figure, if the value B/D is below the lower limit of the conditional formula 3, the efficiency disadvantageously and rapidly deteriorates. On the contrary, if the value B/D is over the upper limit of the conditional formula 1, change in the efficiency is small but the value B (diameter of the optical element) increases, which disadvantageously results in upsizing of the entire element. As can be read from this figure, an even more preferable conditional range is as shown in conditional formula 3' below:

$$2.0 < B/D < 4.0 \qquad (3').$$

Moreover, in the invention, there is provided on the first surface a step or a convex portion for keeping constant the distance from the light source, and conditional formula 4 below is fulfilled:

$$15 < D/L < 1000 \qquad (4),$$

where

D denotes the maximum diagonal length of the light source (the size of the light source, the maximum length of the light source in the length direction perpendicular to the optical axis, the diameter of the light source); and L denotes the distance between the light source and the entrance surface.

Figure 3A:
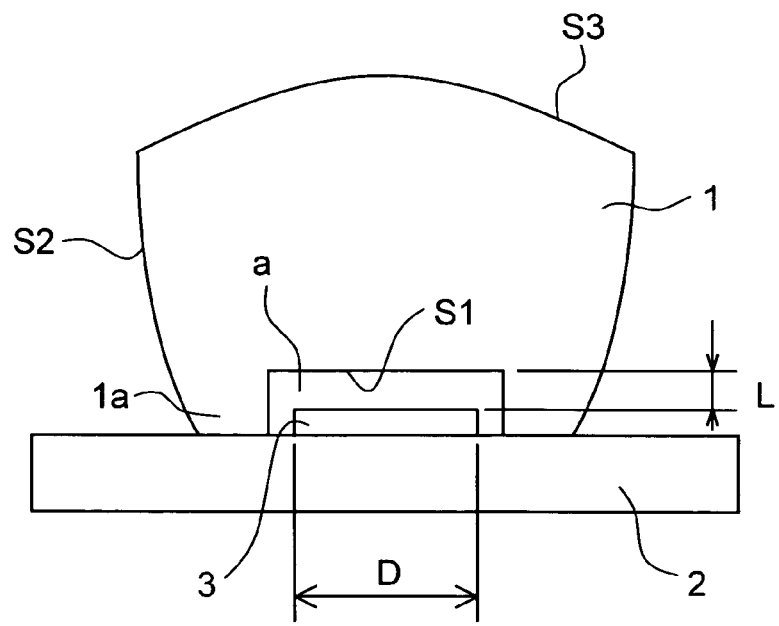
FIG. 3A is a longitudinal sectional view schematically showing one example of actual positional relationship between a light source and an optical element.
Figure 3B:
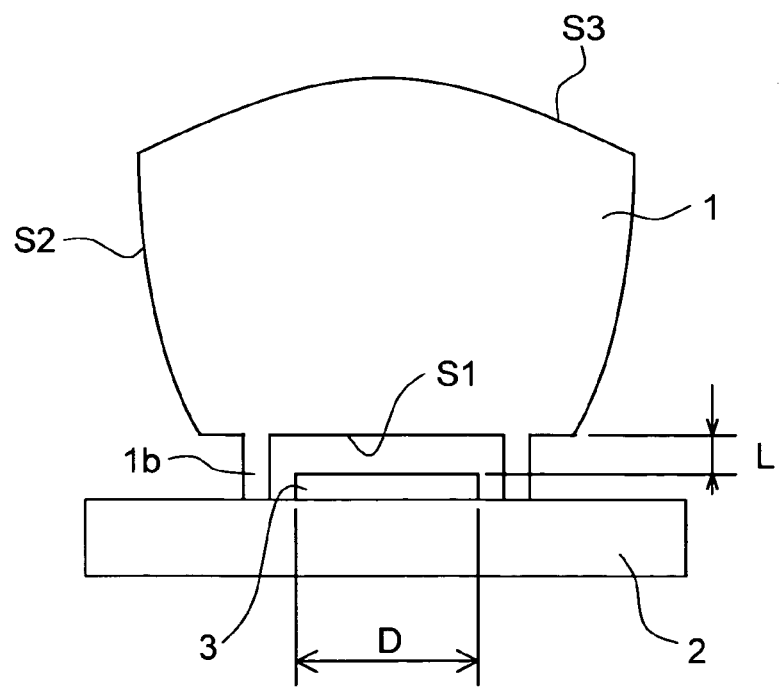
FIG. 3B is a longitudinal sectional view schematically showing another example of the actual positional relationship between the light source and the optical element.

According to this configuration, in which the step or the convex portion is provided on the flat surface part of the first surface so as to keep constant the distance from the light source, a labor of positioning can be omitted. FIGS. 3A and 3B are both longitudinal sectional views schematically showing the actual positional relationship between the light source and the optical element, respectively referring to a case where the step is provided (FIG. 3A) and to a case where the convex portion is provided (FIG. 3B). The step and the convex portion may be formed of the same material as that of the optical element and integrated with the optical element, or may be formed of the same or a different kind of material as or from that of the optical element and bonded to the optical element. In addition, in Example 5, a detailed shape of the step when formed of the same material is shown in the figure.

First, in FIG. 3A, a step part 1a is provided between a fixed part, for a base 2, of the optical element 1 and the first surface S1. As a result, a distance L is kept constant between a light source 3 of a surface form fixed on the base 2 and the first surface S1. In this case, for example, a circular concave portion a is provided at the inner bottom surface of the optical element 1 so that the light source 3 can fit therein and so that the ceiling surface thereof serves as the first surface S1, thereby resulting in configuration such that the step part 1a is formed around the concave portion a.

In FIG. 3B, a convex portion 1b is formed which extends from the first surface S1 to the base 2. As a result, a distance L is kept constant between the light source 3 of a surface form fixed on the base 2 and the first surface S1. In this case, the bottom surface of the optical element 1 serves as the first surface S1, where the convex portion 1b of, for example, a toric shape is formed, in which the light source 3 fits. In each of the figures, S2 and S3 denote the second surface and the third surface, respectively.

Further, the conditional formula 4 defines the relationship in the distance between the light source and the optical element. If the value D/L is below the lower limit of the conditional formula 4, the distance between the optical element and the light source is so large that a ray of light emitted at a large angle from the light source does not enter the optical element, which disadvantageously results in a deterioration in the efficiency. On the contrary, if the value D/L is over the upper limit of the conditional formula 4, it is favorable in terms of efficiency but a too small distance causes a risk of contact between the first surface and the light source due to a manufacturing error of the optical element, which disadvantageously results in difficulty in keeping a predetermined distance. Furthermore, setting the lower limit value of the conditional formula 4 at 100 permits providing an optical element with even higher efficiency.

For example, according to Example 1 to be described later, D is equal to 10 mm, and thus L needs to be 10 μm to fulfill the upper limit value of 1000. The current thickness accuracy in an injection mold or the like can be controlled at several μm at some costs. However, considering temperature-induced expansion, contraction, and the like, a value D/L over the upper limit value of the conditional formula 4 is not preferable since this value results in difficulty in securing the gap accuracy at low price.

Figure 4A:
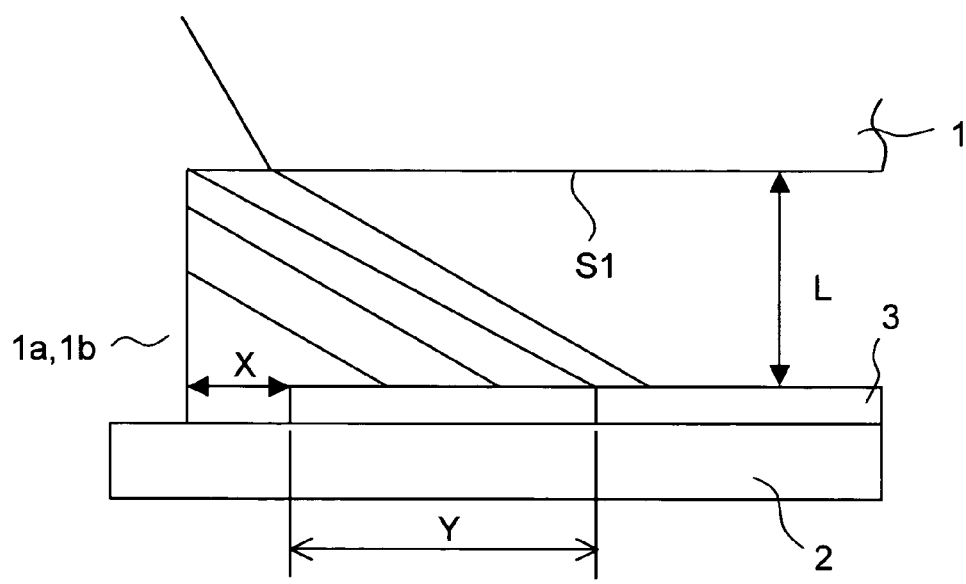
FIG. 4A is a sectional view showing, on an enlarged scale, main parts of the light source and the optical element, in correspondence with both FIGS. 3A and B.
Figure 4B:
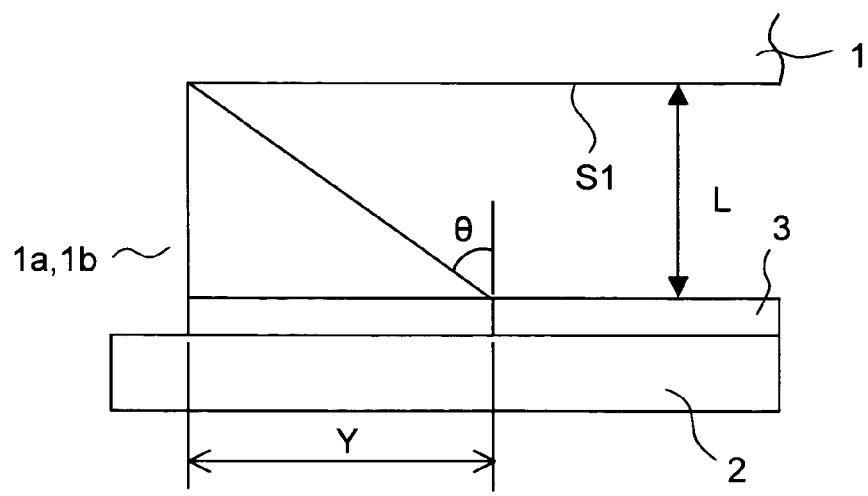
FIG. 4B is a sectional view showing a modified example of the positional relationship between the light source and the optical element.
Figure 5A:
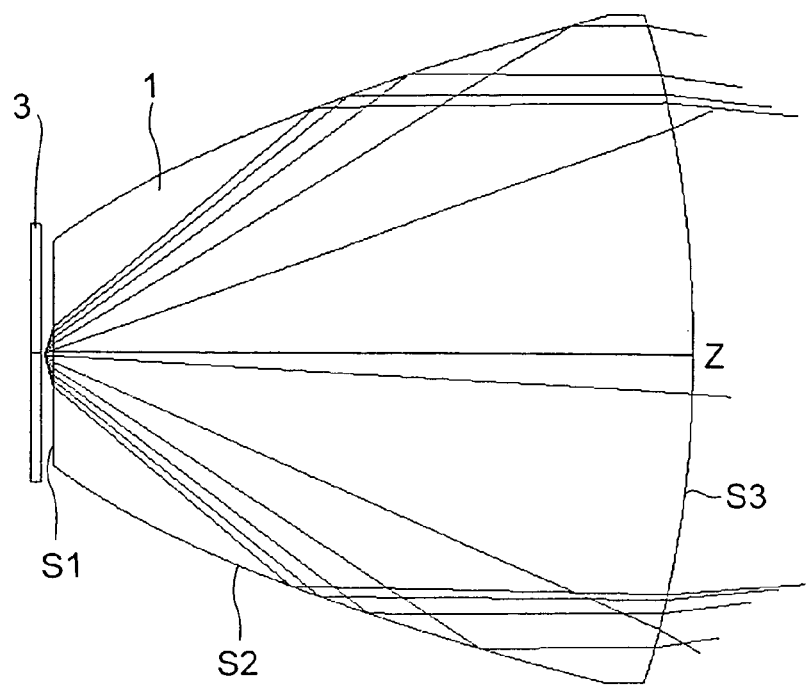
FIG. 5A is an optical path diagram, in cross section, of the optical element in Example 1.
Figure 5B:
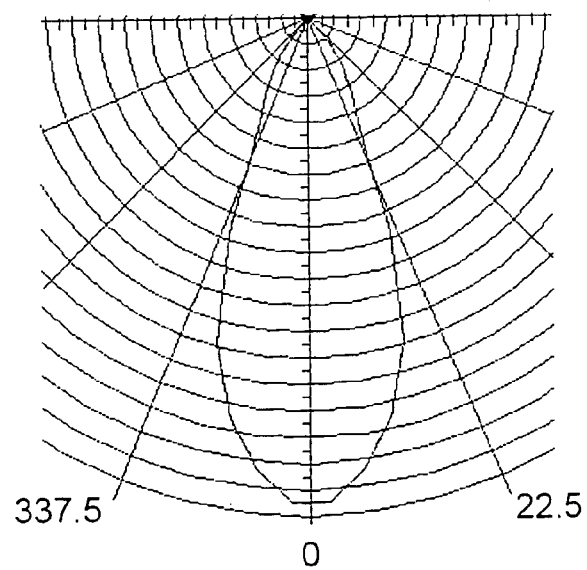
FIG. 5B is a directivity characteristic diagram for the optical element described above.
Figure 6A:
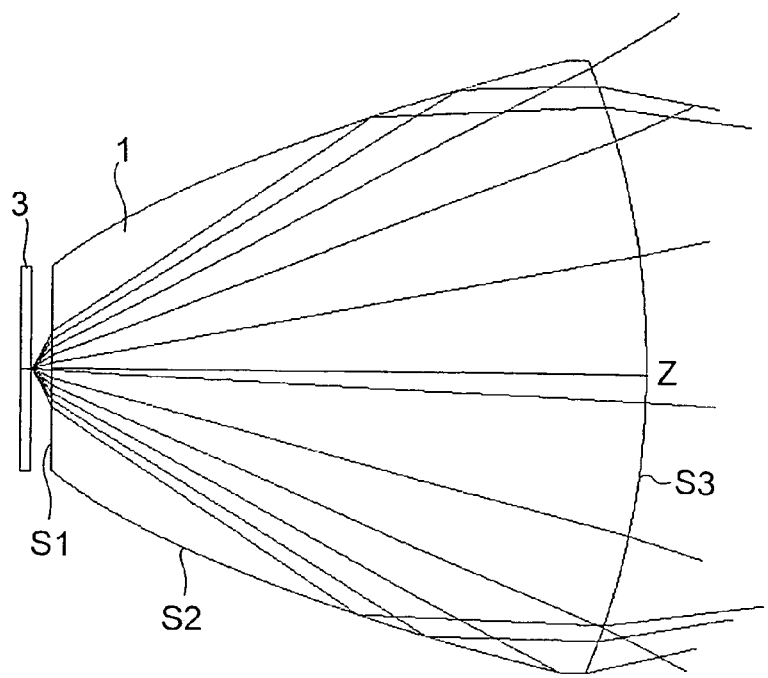
FIG. 6A is an optical path diagram, in cross section, of the optical element in Example 2.
Figure 6B:
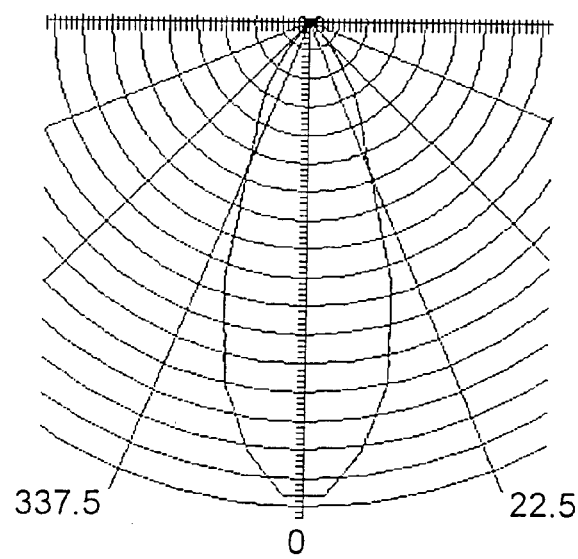
FIG. 6B is a directivity characteristic diagram for the optical element described above.
Figure 7A:
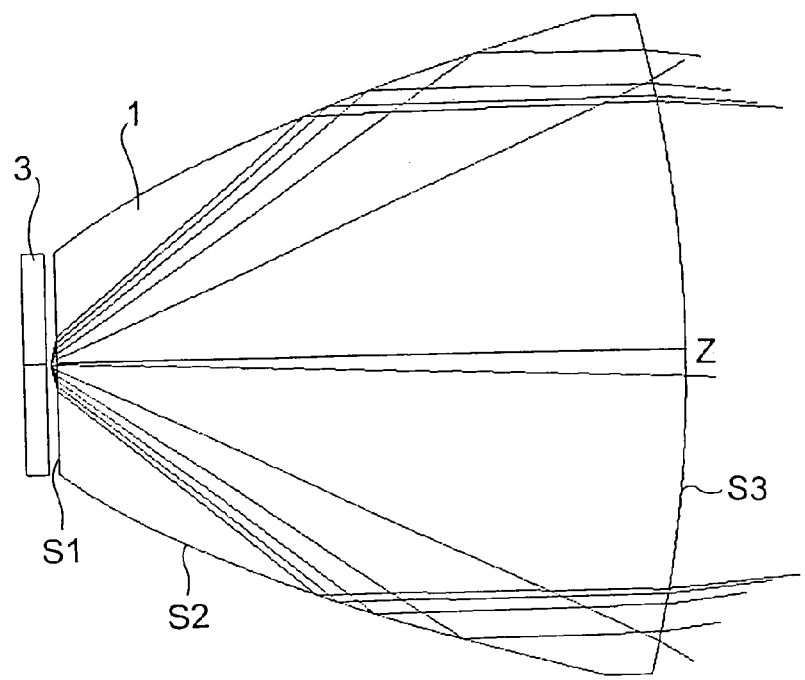
FIG. 7A is an optical path diagram, in cross section, of the optical element in Example 3.
Figure 7B:
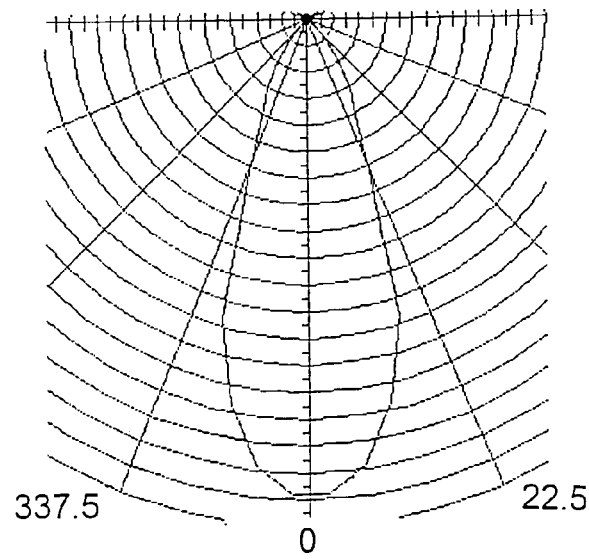
FIG. 7B is a directivity characteristic diagram for the optical element described above.
Figure 8A:
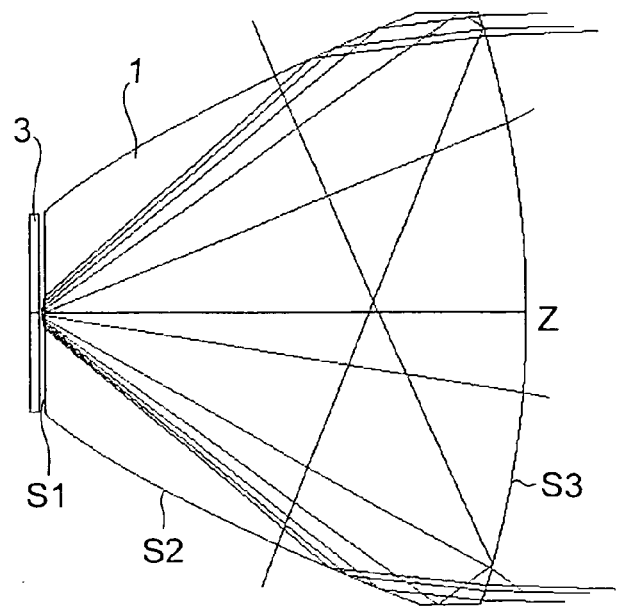
FIG. 8A is an optical path diagram, in cross section, of the optical element in Example 4.
Figure 8B:
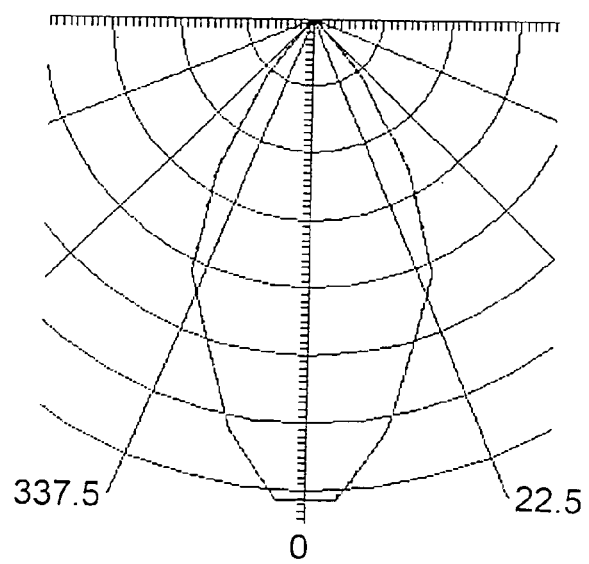
FIG. 8B is a directivity characteristic diagram for the optical element described above.
Figure 9A:
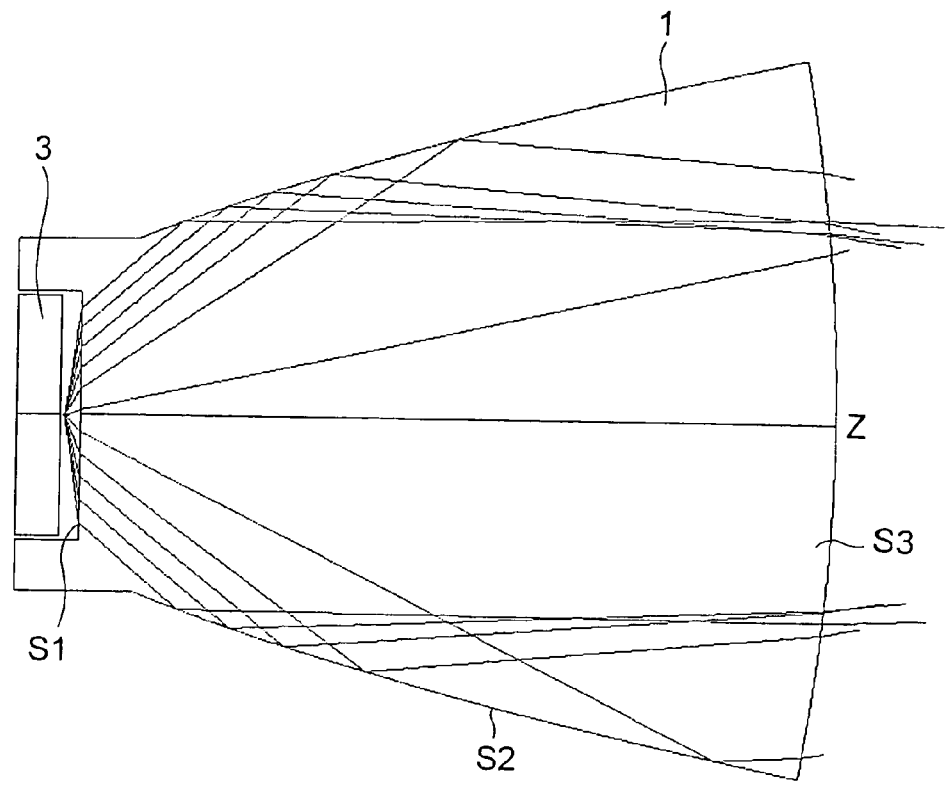
FIG. 9A is an optical path diagram, in cross section, of the optical element in Example 5.
Figure 9B:
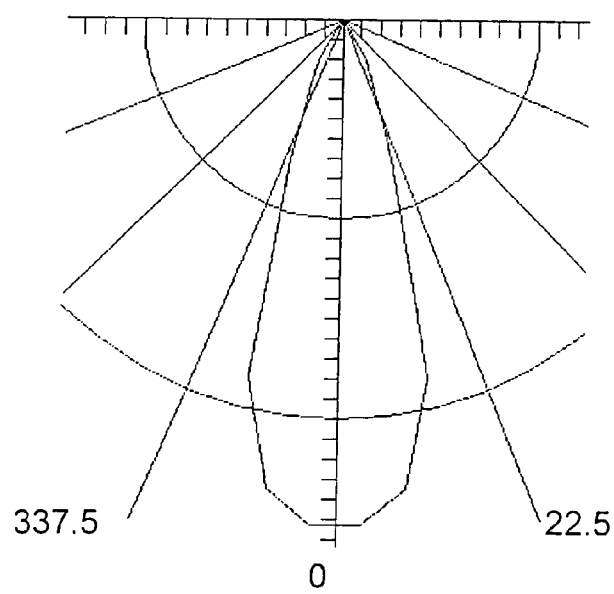
FIG. 9B is a directivity characteristic diagram for the optical element described above.

On the contrary, a too wide gap brings about some manufacturing advantages, but causes a problem as indicated below. FIG. 4A is an enlarged main part diagram in correspondence with both FIGS. 3A and 3B described above. FIG. 4B shows a modified example. As shown in FIG. 4A, rays of light entering from the surrounding part of the light source 3 at large angles enter the step part 1a or the convex portion 1b without entering the first surface S1, which disadvantageously results in failure to effectively use the surrounding part of the light source 3 indicated by a dimension Y. A possible way to avoid this is to increase a dimension X in the figure, that is, the distance between the peripheral part of the light source 3 and the inner side surface of the step part 1a or the convex portion 1b, but this disadvantageously leads to the upsizing of the optical element 1.

For example, when D is equal to 10 mm as is the case with Example 1, assuming that the lower limit value is 15, L is equal to 0.6 mm. In that case, as shown in FIG. 4B, assuming that the exit angle θ of a ray of light from the light source 3 is equal to 60 degrees where X is equal to 0, for a region at the surrounding part of the light source 3 in the figure, where Y is equal to 1.15 mm, a ray of light at an exit angle of 60 degrees or above cannot directly enter the flat surface part of the first surface, which results in a substantially small size of the light source.

Moreover, in the invention, conditional formula 5 below is fulfilled:

$$0.9 < A/D < 3.0 \quad (5),$$

where

A denotes the maximum length of the entrance surface in the direction perpendicular to the optical axis (the diameter of the flat surface part of the first surface); and D denotes the maximum diagonal length of the light source (the size of the light source, the maximum length of the light source in the length direction perpendicular to the optical axis, the diameter of the light source).

According to this configuration, an optimum optical system most suitable for the size of the light source can be provided. The conditional formula 5 defines the ratio in the size between the flat surface part of the first surface and the light source. If the value A/D is below the lower limit of conditional formula 5, the size of the light source is larger than that of the flat surface part, so that light from the surrounding part of the light source disadvantageously does not enter the flat surface. On the contrary, if the value A/D is over the upper limit of the conditional formula 5, the size of the flat surface part and further the size of the optical element itself are disadvantageously too large for the light source.

Moreover, in the invention, conditional formula 6 below is fulfilled:

$$1.0 < Z/(CR2/2) < 6.0 \quad (6),$$

where

CR2 denotes the radius of curvature of the second surface; and

Z denotes an absolute value of the distance between the apex of the second surface and the light source.

According to this configuration, an optical element having an optimum degree of condensation can be provided. The conditional formula 6 indicates the ratio of the focal length of the second surface (CR2/2) with respect to the absolute value of the distance between the light source and the surface apex of the second surface. That is, the conditional formula 6 defines the positional relationship between the focal position and the light source when the second surface is a paraboloidal surface.

The lower limit of the conditional formula 6 means that the light source position almost agrees with the focal position. If the value Z/(CR2/2) is below the lower limit of the conditional formula 6, rays of light near the center of the light source are parallel while light near the surrounding area of the light source diverges, thus resulting in wider directivity as a whole, which leads to failure to provide an optical element with favorable condensing characteristics. On the contrary, if the value Z/(CR2/2) is over the upper limit of the conditional formula 6, all the rays of light exiting from the light source become convergent rays of light, which causes nonuniformity in the directivity characteristic, thus disadvantageously leading to difficulty in achieving uniform illumination.

In each example to be described later, the shape of the third surface is convex, although not limited thereto; thus, a fresnel lens or an achromatic diffractive optical lens may be provided as the third surface. The formation of the fresnel lens permits even more compactification of the optical element. The formation of the achromatic diffractive optical lens permits complete compensation for dispersion of material forming the element by way of total reflection and diffraction.

For example, when a diffractive optical element is formed on a PMMA (polymethylmethacrylate) base material having υd (PMMA) equal to 57. 82 and thereby achromatization is performed, based on the fact that the diffractive optical element has υd (DIFFRACT) equal to −3.45, favorable chromatic correction can be performed in a state close to the condition where formula below is fulfilled:

$$\phi r/\phi d = \upsilon d(\text{PMMA})/\upsilon d(\text{DIFFRACT}),$$

where

φr denotes the refractive power of the third surface; and

φd denotes the diffractive power of the third surface.

Therefore, designing can be achieved in such a manner as to provide such power distribution.

The use of formable plastic material for formation of the optical element permits light-weight and also permits easy machining into an aspherical shape. That is, the plastic material is preferable since it is more light-weight than a glass material or the like and can be made in a large quantity at low costs by employing an injection mold or the like even if its shape is complicated. Examples of such plastic material include polymethylmethacrylate (PMMA), cycloolefin resin (for example, ZEONEX (registered trademark) manufactured by ZEON Corporation), polycarbonate, and the like. More preferably, the plastic material may be athermal resin (to be described later).

Alternatively, the optical element may be formed of material such as silicone, transparent epoxy resin, or the like. The silicone and the transparent epoxy resin have higher glass transition temperature than the plastic material, and thus can be used stably even under high temperature. More specifically, transparent silicone or epoxy resin such as PDMS (polydimethylsiloxane) is suitable. Use of optical glass that can be formed by a glass molding method permits mass production into an aspherical shape at low costs and also permits stable use of such an optical element even under high temperature.

Besides, it is preferable that at least one of the first surface and the third surface be provided with anti-reflection coating. This permits preventing reflection on the superficial surface of the optical element, which in turn permits efficient transmission of rays of light from the light source along the optical axis. On the other hand, the second surface is not provided with a coating, and thus does not impair characteristics as an total reflection surface.

Now, the athermal resin mentioned above will be described. The plastic material suffers from a problem of characteristic fluctuation under the influence of ambient temperature change due to its disposition that the refractive index largely changes with temperature change. However, it has been recently recognized that mixing inorganic fine particles in plastic material can reduce the influence of the temperature change. Typically, mixing fine particles in transparent plastic material causes scattering of light, thereby resulting in a reduction in the transmittance, which makes it difficult to use the plastic material as an optical material. However, scattering can practically be avoided by providing fine particles with a size smaller than the wavelength of a transmitted beam of light.

Moreover, while the increase temperature of the plastic material results in a decrease in the refractive index, the temperature increase of the inorganic particles results in an increase in the refractive index. Thus, almost no change in the refractive index can be observed by utilizing the temperature dependence of these materials in such a manner as to make them cancel out each other. More specifically, dispersing inorganic particles having a maximum length of 20 nm or less in a plastic material as a base material provides a plastic material having a refractive index with extremely low dependence on temperature. For example, dispersing fine particles of niobium oxide ($Nb_2O_5$) in acrylic permits reducing temperature-induced change in the refractive index. In the invention, the use of plastic material, to which such inorganic particles are dispersed, for the optical element permits control of the characteristic fluctuation with temperature change.

Now, the temperature-dependent variation in the refractive index will be described in detail. The temperature-dependent variation TA in the refractive index is represented by formula below obtained by differentiating a refractive index n with a temperature t, based on the Lorentz-Lorentz formula:

$$TA=\{(n^2+2)(n^2-1)/6n\}\times\{(-3\alpha)+(1/[R])(\partial[R]/\partial t)\},$$

where

α denotes a linear coefficient of expansion; and

[R] denotes a molecular refraction.

For plastic base material, compared to the first term in the formula, the second term in the formula typically offers small contribution, which is almost ignorable. For example, for PMMA resin, the linear coefficient of expansion α is $7\times10^{-5}$. Substituting this in the formula above results in $TA=-1.2\times10^{-4}[/° C.]$, which is substantially equal to the actual measurement value. More specifically, it is preferable that the temperature-dependent variation TA in the refractive index, which is conventionally approximately $1.2\times10^{-4}[/° C.]$, be controlled at less than an absolute value of $8\times10^{-5}[/° C.]$, and more preferably at less than an absolute value of $6\times10^{-5}[/° C.]$.

The temperature-dependent variation TA in the refractive index (=dn/dt) for plastic material applicable to the invention are as follows:

| [Plastic material] | [TA (approximate value) [$10^{-5}/°$ C.]] |
|---|---|
| Polyolefin series | −11 |
| Polycarbonate series | −14 |

The temperature-dependent variation TA in the refractive index (=dn/dt) for inorganic material applicable to the invention are as follows, with the sign thereof opposite to that of the plastic material:

| [Inorganic material] | [TA (approximate value) [$10^{-5}/°$ C.]] |
|---|---|
| Aluminum oxide | 1.4 |
| ALON | 1.2 |
| Beryllium oxide | 1.0 |
| Diamond | 1.0 |
| Calcium carbonate | 0.7 |
| Potassium titanium phosphate | 1.2 |
| Magnesium aluminate | 0.9 |
| Magnesium oxide | 1.9 |
| Quartz | 1.2 |
| Tellurium oxide | 0.9 |

-continued

| [Inorganic material] | [TA (approximate value) [$10^{-5}/°$ C.]] |
|---|---|
| Yttrium oxide | 0.8 |
| Zinc oxide | 4.9 |

The examples above refer to the case where fine particles with dn/dt of a different sign from that of plastic material are dispersed. Compared to the plastic material, dispersing fine particles having a small absolute value of dn/dn permits a smaller change in the refractive index even when the sign of dn/dt is the same as that of the plastic material. Note that dispersing fine particles with dn/dt of a different sign from that of the plastic material permits a smaller amount of fine particles to be dispersed in the plastic.

Hereinafter, numerical value data of the optical elements according to the respective examples of this embodiment are shown, where Z denotes the distance along the optical axis which corresponds to a normal line of a light source surface with the center of the light source defined as an origin;

CR denotes the radius of curvature; and k denotes a conic coefficient.

The surface is a paraboloidal surface where k is equal to −1, a spherical surface where k is equal to 0, and is a hyperboloidal surface where k is equal to −1.1.

FIGS. 5A and 5B through 9A and 9B are diagrams for the optical elements according to Examples 1 to example 5, respectively. FIGS. 5A, 6A, 7A, 8A, and 9A are optical path diagrams in cross section, and FIGS. 5B, 6B, 7B, 8B, and 9B are directivity characteristic diagrams. The directivity characteristic diagram shows the ratio of luminous intensity as viewed at a certain angle inclined from the light source where the axial luminous intensity on the light source is 100%, serving as a measure of the degree of widening of light. The vertical axis of the directivity characteristic diagram represents the relative strength when the center is normalized. This figure shows the results of simulation done under the condition that the light source is a surface light source of uniform luminance, with the angle characteristic exhibiting Lambert's distribution. Each of the figures shows generally favorable characteristics. Moreover, as in the energy included within a whole angle of 60 degrees (60 degrees efficiency) in each of the examples to be described later, the figures also prove that much of light is efficiently condensed.

EXAMPLE 1

Material: PMMA
Refractive index (d-line): 1.4914
vd: 57.82

| | [Z (mm)] | [CR (mm)] | [k] | [Effective diameter (mm)] |
|---|---|---|---|---|
| Light source (3) | 0 | INF | 0.00 | 10 |
| First surface (S1) | 0.03 | INF | 0.00 | 10 |
| Second surface (S2) surface apex | −3.095 | 4 | −1.00 | 30 |
| Third surface (S3) surface apex | 29.03 | −50 | 0.00 | 30 |

EXAMPLE 2

Material: Polycarbonate
Refractive index (d-line): 1.5834
vd: 30.23

| | [Z (mm)] | [CR (mm)] | [k] | [Effective diameter (mm)] |
|---|---|---|---|---|
| Light source (3) | 0 | INF | 0.00 | 10 |
| First surface (S1) | 0.5 | INF | 0.00 | 10 |
| Second surface (S2) surface apex | −2.625 | 4 | −1.00 | 30 |
| Third surface (S3) surface apex | 29.5 | −40 | 0.00 | 30 |

EXAMPLE 3

Material: SF6 (One of the glass material)
Refractive index (d-line): 1.80542
vd: 26.12

| | [Z (mm)] | [CR (mm)] | [k] | [Effective diameter (mm)] |
|---|---|---|---|---|
| Light source (3) | 0 | INF | 0.00 | 5 |
| First surface (S1) | 0.03 | INF | 0.00 | 5 |
| Second surface (S2) surface apex | −1.53 | 2 | −1.00 | 15 |
| Third surface (S3) surface apex | 14.53 | −30 | 0.00 | 15 |

EXAMPLE 4

Material: PMMA
Refractive index (d-line): 1.4914
vd: 57.82

| | [Z (mm)] | [CR (mm)] | [k] | [Effective diameter (mm)] |
|---|---|---|---|---|
| Light source (3) | 0 | INF | 0.00 | 10 |
| First surface (S1) | 0.03 | INF | 0.00 | 10 |
| Second surface (S2) surface apex | −3.095 | 4 | −1.10 | 30 |
| Third surface (S3) surface apex | 29.03 | −50 | 0.00 | 30 |

EXAMPLE 5

Material: PMMA
Refractive index (d-line): 1.4914
vd: 57.82

| | [Z (mm)] | [CR (mm)] | [k] | [Effective diameter (mm)] |
|---|---|---|---|---|
| Light source (3) | 0 | INF | 0.00 | 10 |
| First surface (S1) | 0.6 | INF | 0.00 | 10 |
| Second surface (S2) surface apex | −6.753 | 3 | −1.00 | 30 |
| Third surface (S3) surface apex | 32.15 | −80 | 0.00 | 30 |

Values for the conditional formulae in the examples are shown below.

| | [Example 1] | [Example 2] | [Example 3] | [Example 4] | [Example 5] |
|---|---|---|---|---|---|
| Conditional formula 1 $r/(n − n')$ TL | 4.07 | 2.74 | 2.98 | 4.07 | 5.1 |
| Conditional formula 3 B/D | 3 | 3 | 3 | 3 | 3 |
| Conditional formula 4 D/L | 333 | 20 | 166 | 333 | 16.6 |
| Conditional formula 5 A/D | 1 | 1 | 1 | 1 | 1.025 |
| Conditional formula 6 $Z/(CR2/2)$ | 1.55 | 1.31 | 1.53 | 1.55 | 4.5 |

Moreover, the 60 degrees efficiency in the examples are shown below.

|  | [Example 1] | [Example 2] | [Example 3] | [Example 4] | [Example 5] |
|---|---|---|---|---|---|
| 60 degrees efficiency [%] | 78.0 | 69.2 | 75.5 | 73.0 | 88.4 |

EMBODIMENT 2

Another embodiment of the invention will be described below with reference to the drawings. For convenience in the description, those configured in the same manner as in the first embodiment are provided with the same member numbers, and thus are omitted from the description.

Figure 10:
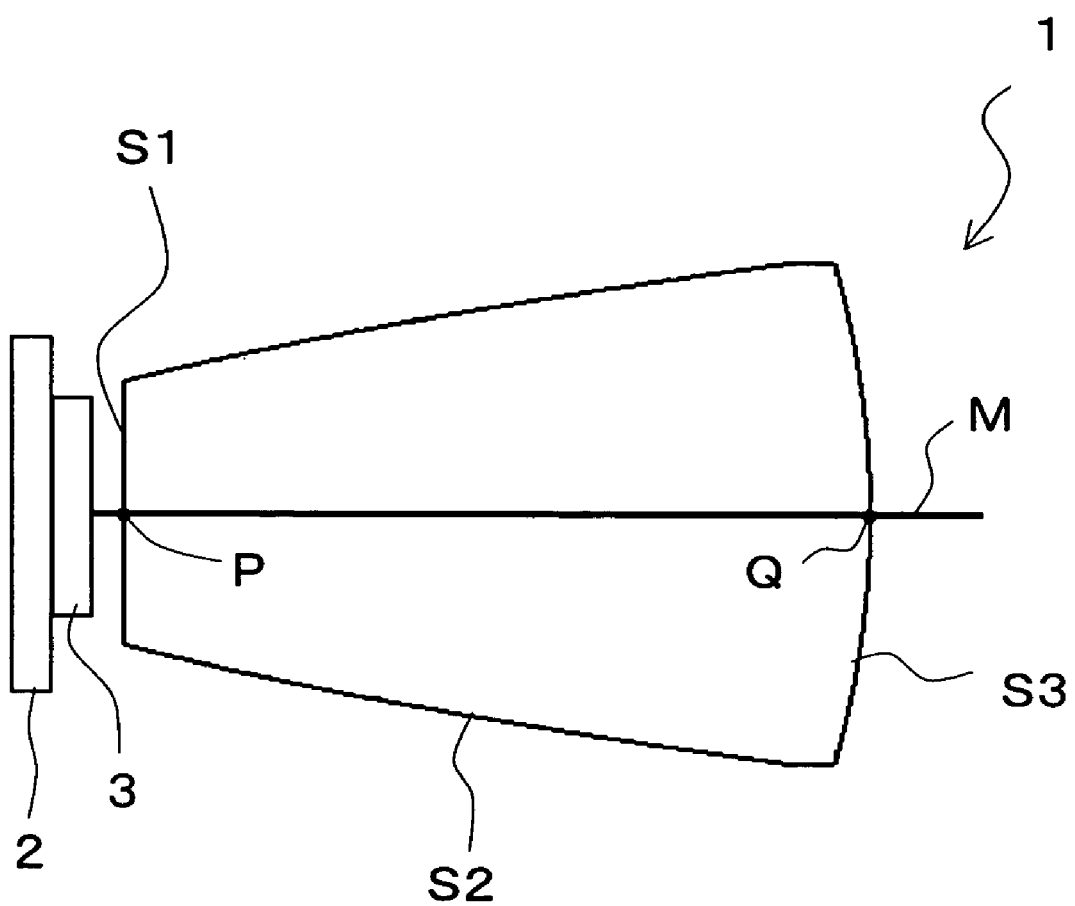
FIG. 10 is a plan view schematically showing the general configuration of a lighting device according to another embodiment of the invention.

FIG. 10 is a plain view schematically showing the general configuration of a lighting device of this embodiment. This lighting device has an optical element 1, and a light source 3 held on a base 2. The light source 3 emits light, and is, as in the first embodiment, formed of a semiconductor light-emitting element (solid-state light-emitting element), such as a light-emitting diode (LED) or the like. The light source 3 may be a surface light source (with a light emitting part thereof shaped in a surface form) or a point light source.

The optical element 1 condenses light emitted from the light source 3, and has an entrance surface (S1), a reflection surface (S2), and an exit surface (S3). The entrance surface is a surface where light from the light source 3 enters. The exit surface is a surface from which light entering via the entrance surface exits. The reflection surface is a surface that directs part of light entering via the entrance surface to the exit surface by total reflection.

The reflection surface of the optical element 1 is formed into, for example, a rotationally symmetric shape. For convenience in the description below, provided that a point where the axis of symmetry (rotational axis of symmetry) M of the reflection surface intercepts with the entrance surface is P and that a point thereof that intercepts with the exit surface is Q, the straight line passing through the two points P and Q is an optical axis.

The optical element 1 of this embodiment has the reflection surface between the entrance surface and the exit surface. A ray of light at a large exit angle is reflected on the reflection surface, forming a small angle with respect to the optical axis, thereby permitting an improvement in the directivity of a ray of light emitted from the light source 3. Moreover, as the reflection surface, a paraboloidal surface, an ellipsoidal surface, or a hyperboloidal surface is used, thereby permitting a smaller angle formed between a ray of light and the optical axis after reflection than the angle formed between the ray of light and the optical axis before the reflection, which in turn permits an improvement in the directivity of a ray of light from the light source 3. In addition, changing the travel direction of a ray of light by total reflection on the reflection surface eliminates the need for providing the reflection surface with a reflection coating, thus permitting reduction in the machining costs.

Moreover, in this embodiment, the optical element 1 fulfills conditional formula 7 below:

$$0.3 < a/b < 1.4 \quad (7),$$

where a denotes the maximum length of the exit surface in the direction perpendicular to the axis of symmetry (mm); and b denotes the surface gap on the axis of symmetry between the entrance surface and the exit surface, that is, the distance between the points P and Q (mm).

It is more preferable that the optical element 1 fulfill conditional formula below:

$$0.35 < a/b < 1.2.$$

Furthermore, it is the most preferable that the optical element 1 fulfill conditional formula below:

$$0.38 < a/b < 0.8.$$

The conditional formula 7 defines the relationship between the full length and the diameter of the optical element 1. Fulfilling the conditional formula 7 permits providing a compact (with a short diameter), highly effective (with high directivity) optical element 1. Hereinafter, these points will be described in detail.

Here, the ratio of rays of light forming an angle of 30 degrees or below with respect to the optical axis (since the whole angle is 60 degrees obtained by multiplying 30 degrees by 2, also called 60 degrees efficiency) is used as a measure of the directivity, and it is assumed that the directivity of a ray of light is high at the 60 degrees efficiency. That is, in terms of a solid angle, a whole angle of 60 degrees corresponds to 13% of a whole angle of 180 degrees, and the ratio of rays of light at a whole angle of 60 degrees or below corresponds to the ratio of rays of light, out of those emitted to the entire hemisphere, falling within approximately 10% of the angle region; thus, the ratio of rays of light included within a whole angle of 60 degrees can serve as a measure of directivity.

Figure 11:
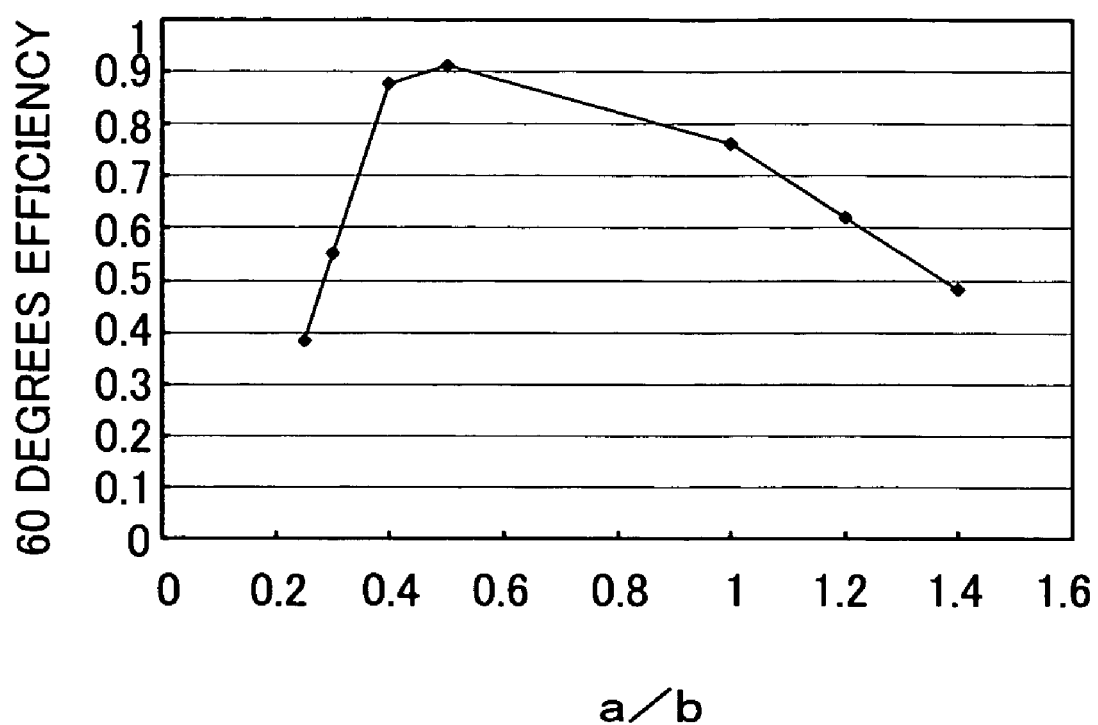
FIG. 11 is a graph showing change in 60 degrees efficiency with various values substituted in conditional formula 7.

FIG. 11 is a graph showing change in the 60 degrees efficiency with various a/b values. This figure shows the results obtained through simulation done under the condition that the light source 3 is a circular surface light source of uniform luminance, with the angle characteristic exhibiting Lambert's distribution, that is, the results obtained through simulation done by varying the diameter (corresponding to a described above) of the optical element 1 whose distance (corresponding to b described above) on the optical axis from the entrance surface to the exit surface is five times the diameter of the light source 3. The entrance surface and the exit surface are flat surfaces, and the reflection surface is a paraboloidal surface. The diameter of the circular surface light source is equal to the diameter of the entrance surface. According to this figure, the 60 degrees efficiency deteriorates when the a/b value is below the lower limit value of the conditional formula 7 and when the a/b value is over the upper limit value thereof; thus, it can be said that the directivity of a ray of light deteriorates.

That is, when the a/b value is below the lower limit value of the conditional formula 7, the angle formed between a ray of light and the optical axis after reflection on the reflection surface is similar to the angle formed therebetween before the reflection, so that the angle formed between the ray of light and the optical axis is not small, thus resulting in lower directivity of the ray of light. Moreover, when the a/b value is over the upper limit value of the conditional formula 7, of rays of light entering the optical element 1, a smaller proportion reaches the reflection surface, thus resulting in lower directivity of the rays of light.

Therefore, by fulfilling the conditional formula 7, a large proportion of rays of light entering the optical element 1 are reflected on the reflection surface and then directed to the exit surface with a reduced angle formed with respect to the optical axis, thus permitting an improvement in the directivity of the rays of light.

It is preferable that a conic shape or a curved shape of a polynomial aspherical surface be adopted as the shape of the reflection surface of the optical element 1. The adoption of the shape described above for the reflection surface can provide a smaller angle formed between a ray of light entering each point on the reflection surface and the optical axis after the reflection, compared to the angle in a case where, for example, a circular conic surface is used as the reflection surface, thus permitting an improvement in the directivity of the ray of light.

Table 1 shows the values of 60 degrees efficiency when the reflection surface is formed in a paraboloidal shape and when it is formed a circular conic shape. This figure shows the results obtained through simulation done under the condition that the light source 3 is a circular surface light source of uniform luminance, with the angle characteristic exhibiting having Lambert's distribution, that is, the results obtained through simulation done by varying the shape of the reflection surface in the optical element 1 whose distance on the optical axis from the entrance surface to the exit surface is five times the diameter of the light source 3. The entrance surface and the exit surface are plane surfaces, and the diameter of the circular surface light source is equal to the diameter of the entrance surface. Symbol e in Table. 1 represents the diameter (in mm) of the entrance surface. Table. 1 proves that, when the reflection surface is a paraboloidal surface, the value of 60 degrees efficiency is larger than when the reflection surface is a circular conic surface, thus permitting an improvement in the directivity of a ray of light.

TABLE 1

| | | 60 degrees efficiency (%) | |
|---|---|---|---|
| a/b | e/a | Paraboloidal surface | Circular conic surface |
| 1 | 0.2 | 76.08 | 69.63 |
| 0.5 | 0.4 | 91.1 | 86.73 |

When a paraboloidal surface or a spheroidal surface is adopted as the reflection surface, it is preferable that the distance between the focal point of the reflection surface and the entrance surface be larger than the distance between the light emitting surface and the entrance surface. This permits a large proportion of rays of light entering the optical element 1 to form a smaller angle with respect to the optical axis after reflected on the reflection surface.

Figure 12A:
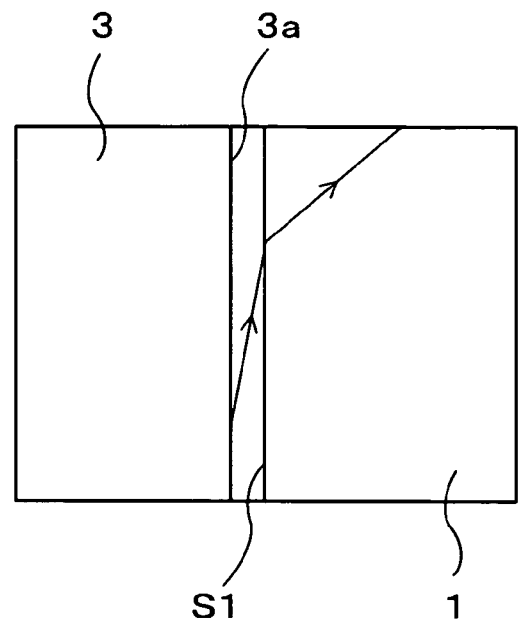
FIG. 12A is an explanatory diagram showing an optical path of a ray of light when there is an air gap between the light emitting surface of the light source and an entrance surface.
Figure 12B:
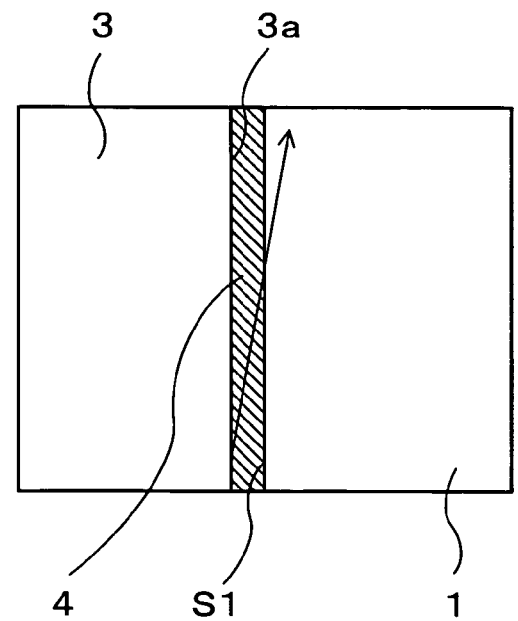
FIG. 12B is an explanatory diagram showing an optical path of a ray of light when there is an adhesive between the light emitting surface and the entrance surface.

In this embodiment, as shown in FIG. 10, the optical element 1 is arranged with an air gap provided between this optical element 1 and the light source 3. FIG. 12A is an explanatory diagram showing the optical path of a ray of light when there is an air gap between the light emitting surface of the light source 3 (3a) and the entrance surface (S1), and FIG. 12B is an explanatory diagram showing the optical path of a ray of light when an adhesive 4 used for fitting the optical element 1 is placed between the light emitting surface and the entrance surface. In both FIGS. 12A and 12B, the entrance surface is a flat surface.

In FIG. 12B, if the refractive index of the adhesive 4 is the same as that of the optical element 1, a ray of light from the light source 3 enters the entrance surface of optical element 1 via the adhesive 4 without being bent. At this point, if the ray of light enters at a large angle of incidence with respect to the entrance surface, the angle formed between the ray of light and the optical axis remains large.

On the contrary, as shown in FIG. 12A, when there is an air gap between the light emitting surface of the light source 3 and the entrance surface, even if a ray of light from the light source 3 enters the entrance surface at a large angle of incidence, the ray of light is refracted on the entrance surface, thus forming a smaller angle between the optical axis and the ray of light. Therefore, the arrangement of the optical element 1 with the air gap provided between this optical element 1 and the light source 3 permits an improvement in the directivity of a ray of light entering the entrance surface.

The presence of the air gap between the light emitting surface and the entrance surface also provides effect of easy attachment and detachment of the optical element 1 to and from the base 2 (see FIG. 10) without requiring the adhesive 4, which is used for the attachment of the optical element 1, to be placed between the light emitting surface and the entrance surface.

It is preferable that the optical element 1 of this embodiment fulfill conditional formula 8 below:

$$0.15 < |b/c| < 1.8 \quad (8),$$

where
c denotes the paraxial radius of curvature of the exit surface (mm).

It is more preferable that the optical element 1 fulfill conditional formula below:

$$0.5 < |b/c| < 1.6.$$

Furthermore, it is the most preferable that the optical element 1 fulfill conditional formula below:

$$0.7 < |b/c| < 1.5.$$

This conditional formula 8 defines the relationship between the full length of optical element 1 and the shape (radius of curvature) of the exit surface. Fulfilling the conditional formula 8 permits, of rays of light entering the entrance surface of the optical element 1, both those reaching the exit surface not via the reflection surface and those reaching the exit surface via the reflection surface to exhibit smaller angle distribution after the passage through the exit surface, thus permitting an improvement in the directivity of the rays of light.

More specifically, if the |b/c| value is below the lower limit value of the conditional formula 8, of rays of light entering the entrance surface, those entering the exit surface not via the reflection surface forms a large angle of incidence with respect to the exit surface, thus providing large effect of refraction on the exit surface, which results in large angle distribution of the rays of light after the passage through the exit surface. On the other hand, if the |b/c| value is over the upper limit value of the conditional formula 8, of rays of light entering the entrance surface, those entering the exit surface via the reflection surface are largely refracted on the exit surface, thus resulting in large angle distribution of the rays of light after the passage through the exit surface.

Figure 13:
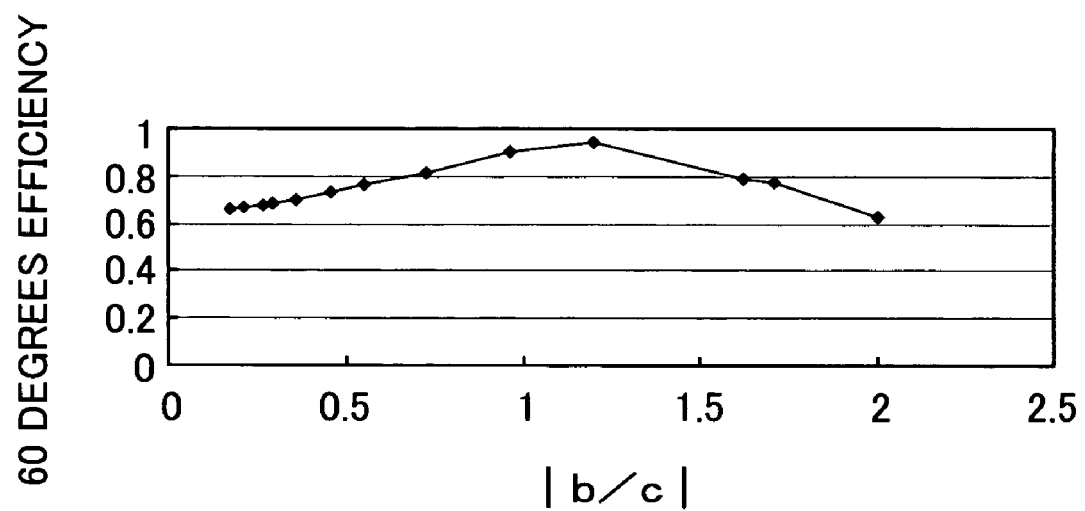
FIG. 13 is a graph showing change in 60 degrees efficiency with various values substituted in conditional formula 8.

FIG. 13 is a graph showing change in the 60 degrees efficiency with various |b/c| values. This figure shows the results obtained through simulation done under the condition that the light source 3 is a circular surface light source of uniform luminance, with the angle characteristic exhibiting Lambert's distribution, that is, the results obtained through simulation done by varying the radius of curvature of the exit surface under the condition that the exit surface is formed in a spherical shape in the optical element 1 whose length on the optical axis when the reflection surface is projected on the optical axis is five times the diameter of the optical source 3 and whose maximum diameter (maximum diameter of the exit surface) is six times the optical source 3. The entrance surface and the exit surface are flat surfaces, and the reflection surface is a paraboloidal surface. This figure proves that the 60 degrees efficiency is low when the |b/c| value is below the lower limit value of the conditional formula 8 and when the |b/c| value is over the upper limit value thereof.

The exit surface may be formed in an aspherical shape with curvature thereof becoming increasingly smaller toward the periphery from the optical axis. In this case, the angle of incidence formed by a ray of light entering the exit surface via the reflection surface with respect to the exit surface can be reduced, thus permitting an improvement in the directivity of the ray of light.

It is preferable that the optical element 1 of this embodiment fulfill conditional formula 9 below:

$$0.001 < d/b < 0.20 \qquad (9),$$

where d denotes the maximum distance from the light emitting surface of the light source 3 to the entrance surface of the optical element 1 (mm).

The conditional formula 9 defines the relationship between the full length of the optical element 1 and the maximum distance from the light emitting surface of the light source 3 to the entrance surface. If the d/b value is below the lower limit value of the conditional formula 9, the light source 3 and the optical element 1 approach each other, thus requiring high accuracy in machining of the optical element 1. On the other hand, if the d/b value is over the upper limit value of the conditional formula 9, of rays of light emitted from the light source 3, the ratio of those entering the entrance surface is small. Thus, fulfilling the conditional formula 9 permits increasing the ratio of rays of light entering the entrance surface, out of those emitted from the light emitting surface of the light source 3, without requiring the optical element 1 to have high machining accuracy, thereby improving the directivity of the rays of light from the light source 3.

Figure 14:
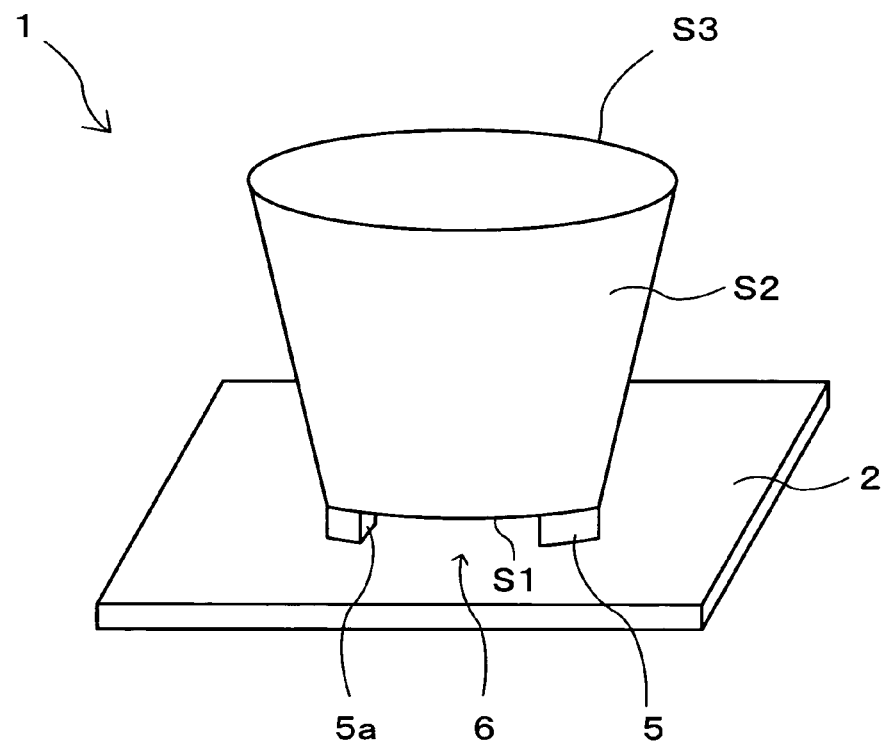
FIG. 14 is a perspective view showing a configuration example of an optical element applied to the lighting device described above.
Figure 15:
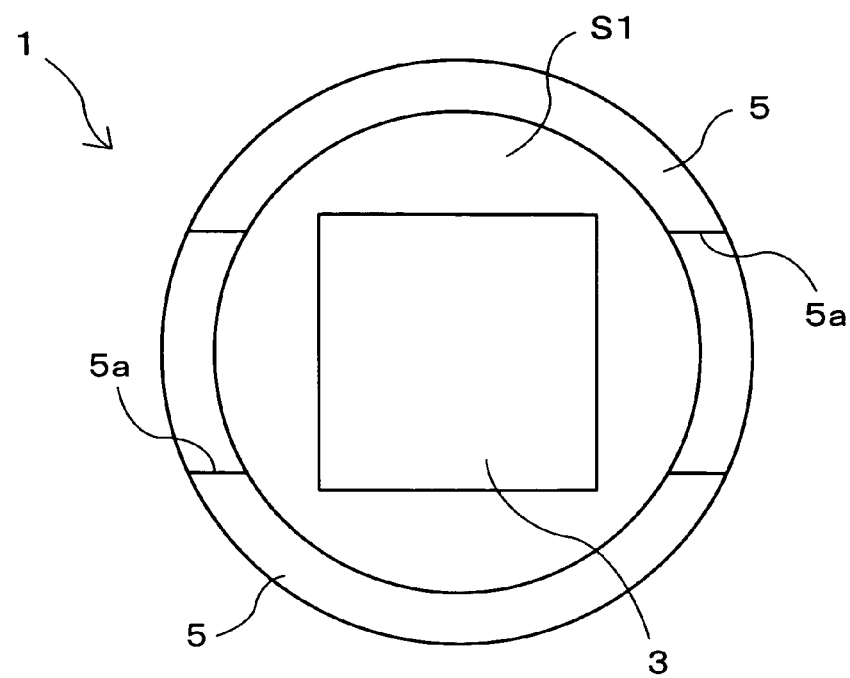
FIG. 15 is a plan view of the optical element described above as viewed from the light source side.

Note that the optical element 1 of this embodiment may be configured in the following manner. FIG. 14 is a perspective view showing another configuration example of the optical element 1 of this embodiment. FIG. 15 is a plain view as viewed from the light source 3 side of the optical element 1 described above. This optical element 1 corresponds to that in Example 12 to be described later.

On the entrance surface of the optical element 1 (S1), a projection 5 is provided which abuts the base 2 where the light source 3 is loaded. This projection 5 forms, together with the entrance surface, a concave portion 6 for storing the light source 3. The projection 5 is formed at the periphery of the entrance surface (portion away from the optical axis), that is, on the entrance surface near the reflection surface. The projection 5 and the entrance surface may be integrated together, or may be formed of different members, which are attached to each other.

The optical element 1 so formed as to fulfill the conditional formulae 7 to 9 described above has a lower ratio of rays of light entering the portion of the reflection surface near the entrance surface than an optical element so formed as not to fulfill the conditional formulae 7 to 9, thus permitting installation of the optical element 1 with respect to the base 2 or the light source 3 with compact configuration without deteriorating the condensation efficiency.

Moreover, the positioning of the optical element 1 with respect to the base 2 or the light source 3, which is done by bringing the projection 5 to abut the base 2, is achieved easily. In addition, in accordance with the length of the projection 5 in the direction in which the projection 5 projects, the distance between the light emitting surface of the light source 3 and the entrance surface can be set freely. Furthermore, the light source 3 on the base 2 is stored in the concave portion 6 when the projection 5 is brought to abut the base 2, thus permitting achieving a compact lighting device.

As shown in FIGS. 14 and 15, the projection 5 has a notch 5a. This notch 5a permits heat generated, upon abutting between the projection 5 and the base 2, from the light source 3 stored in the concave portion 6 to escape to the outside. In this embodiment, the notch 5a is provided at two areas positioned mutually symmetrically with respect to the optical axis, although the number and formation position of notches 5a are not limited thereto.

Providing the projection 5 with the notch 5a in this manner permits the heat from the light source 3 stored in the concave portion 6 to escape to the outside via the notch 5a, thus improving heat escapability, which consequently prevents the heat-induced deterioration in the light emitting efficiency of the light source 3. Moreover, the optical element 1 so configured as to fulfill the conditional formulae 7 to 9 has a lower ratio of rays of light entering the portion of the reflection surface near the entrance surface than an optical element so configured as not to fulfill the conditional formulae 7 to 9, thus permitting dispersion of heat from the light source 3 without deteriorating the condensation efficiency.

It is preferable that the optical element 1 of this embodiment fulfill conditional formula 10 below:

$$0.16 < e/a < 0.8 \qquad (10),$$

where e denotes the maximum length of the entrance surface in the direction perpendicular to the axis of symmetry (mm).

This conditional formula 10 defines the ratio between the diameter of the entrance surface and the diameter of the exit surface. If the e/a value is below the lower limit value of the conditional formula 10, the diameter of the exit surface is large and the ratio of rays of light reaching the reflection surface is small, which fails to provide a compact optical element 1. On the other hand, if the e/a value is over the upper limit value of the conditional formula 10, the angle formed between a ray of light reflected on the reflection surface and the optical axis is approximately equal to the angle formed before the reflection, thus resulting in failure to improve the directivity of the ray of light. Therefore, fulfilling the conditional formula 10 permits improving the directivity of a ray of light from the light source 3 while providing the optical element 1 with compact configuration.

Figure 16:
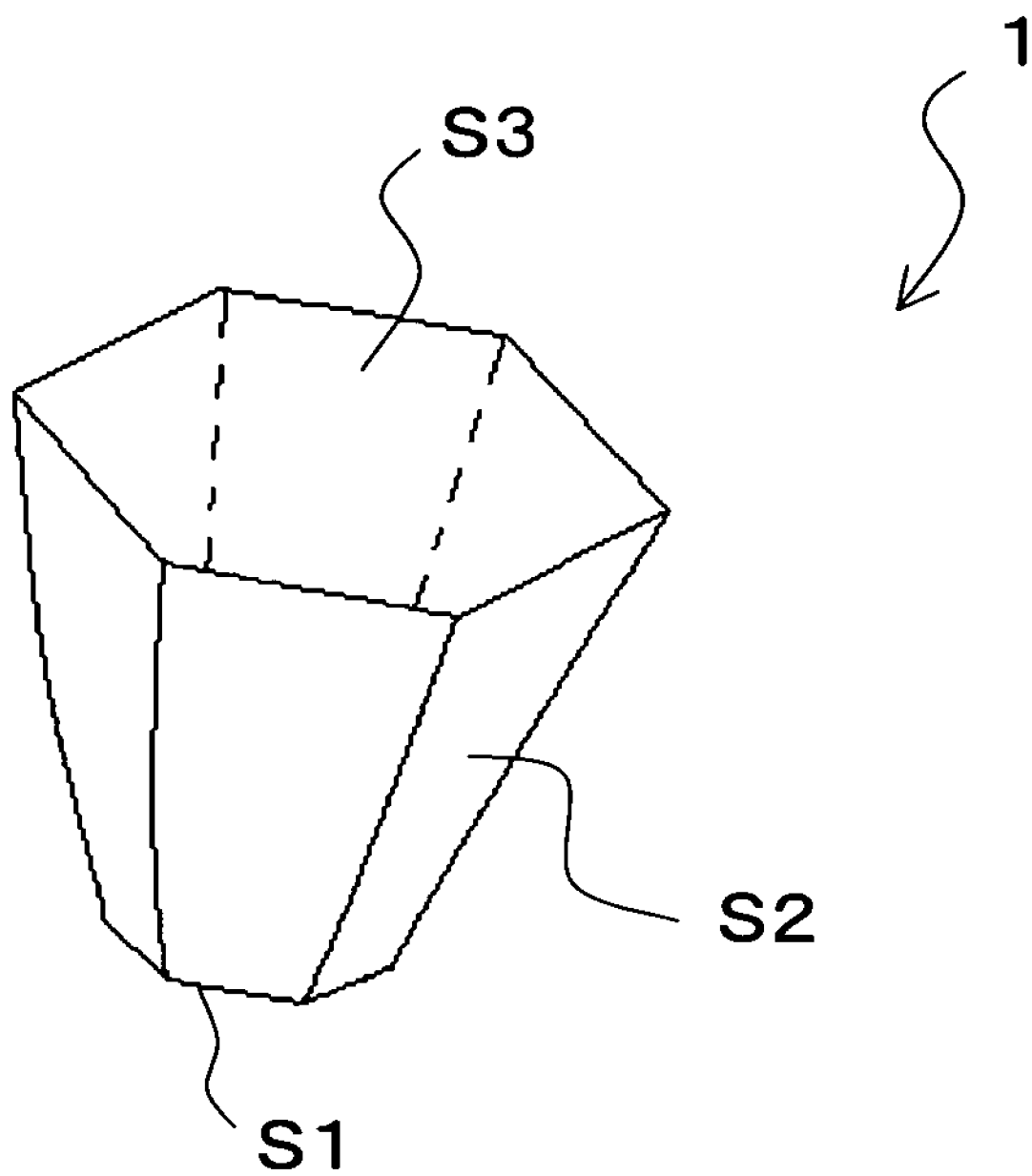
FIG. 16 is a perspective view showing the external configuration of an optical element having a reflection surface with an axis of symmetry of sixfold rotation.
Figure 17A:
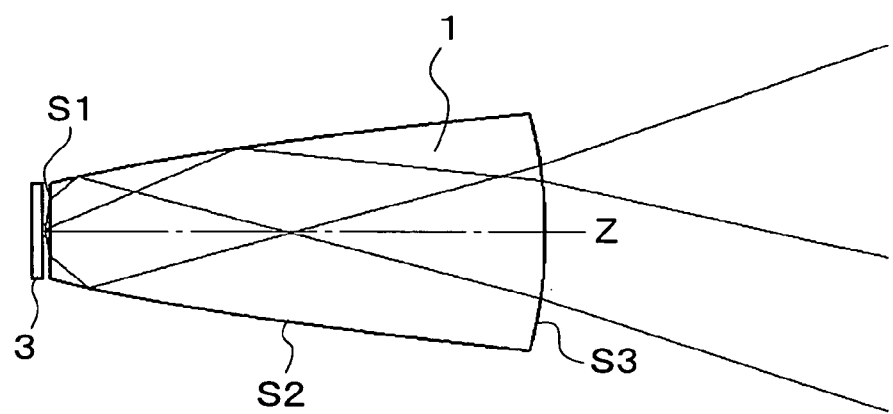
FIG. 17A is an optical path diagram, in cross section, of the optical element in Example 6.
Figure 17B:
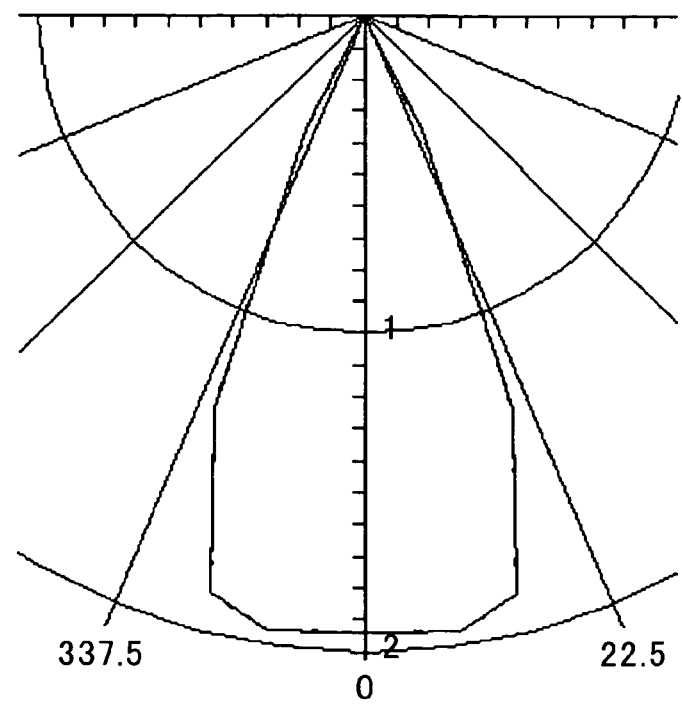
FIG. 17B is a directivity characteristic diagram for the optical element described above.
Figure 18A:
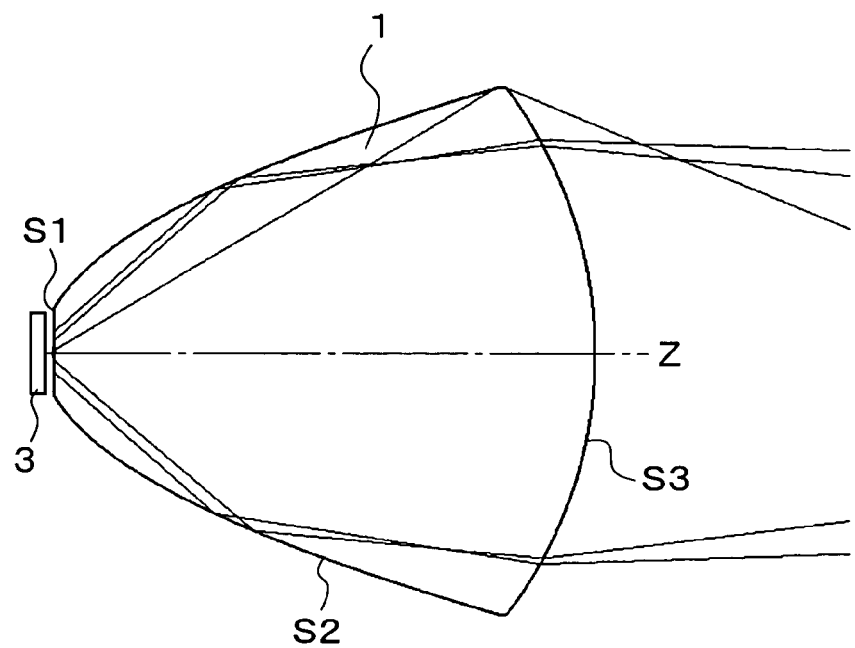
FIG. 18A is an optical path diagram, in cross section, of the optical element in Example 7.
Figure 18B:
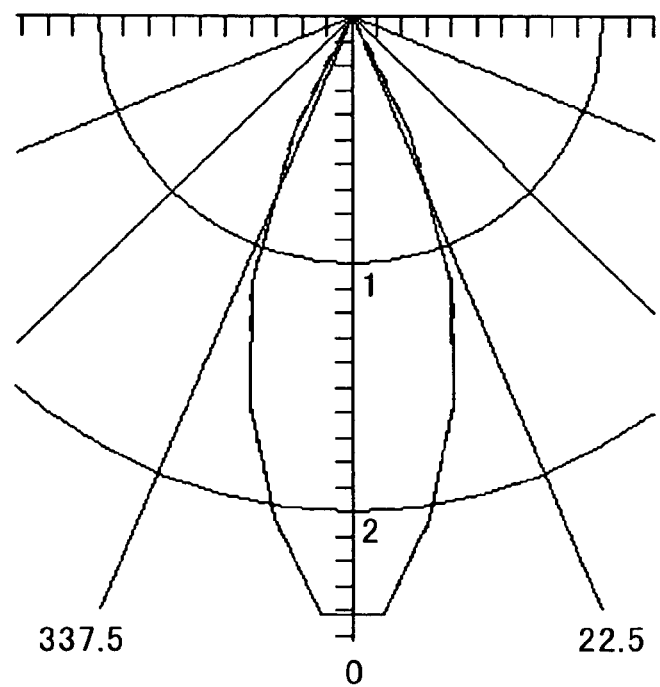
FIG. 18B is a directivity characteristic diagram for the optical element described above.
Figure 19A:
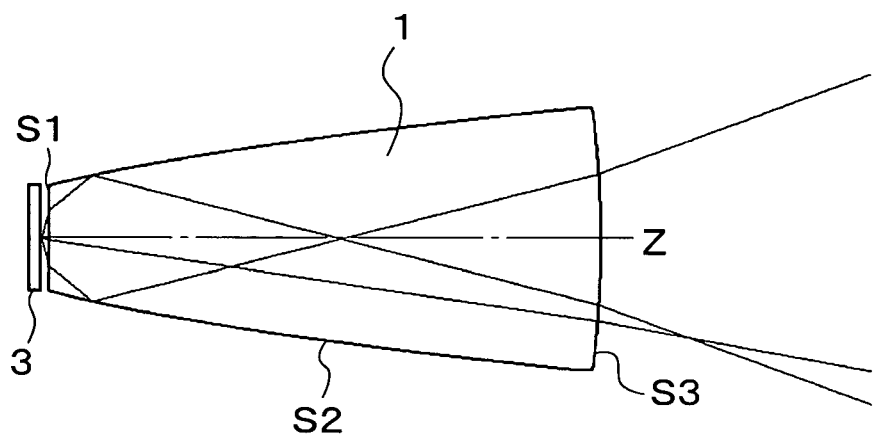
FIG. 19A is an optical path diagram, in cross section, of the optical element in Example 8.
Figure 19B:
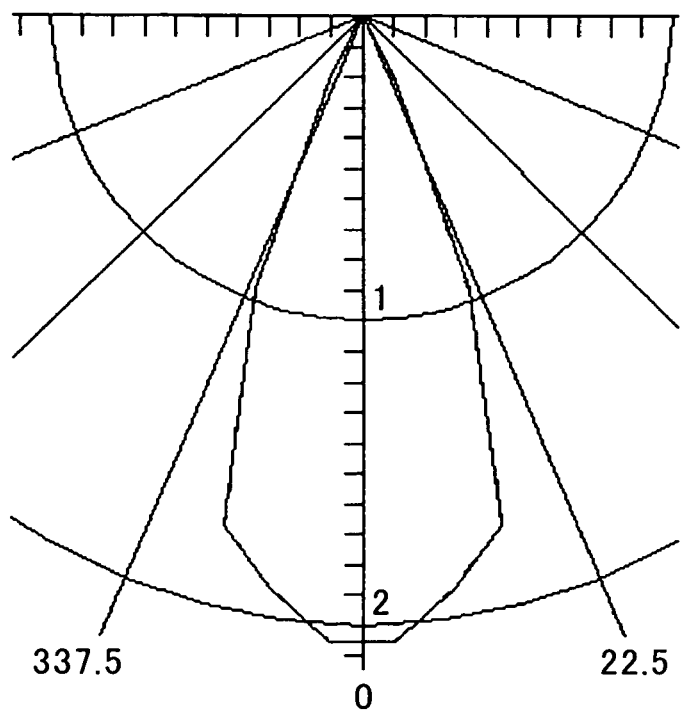
FIG. 19B is a directivity characteristic diagram for the optical element described above.
Figure 20A:
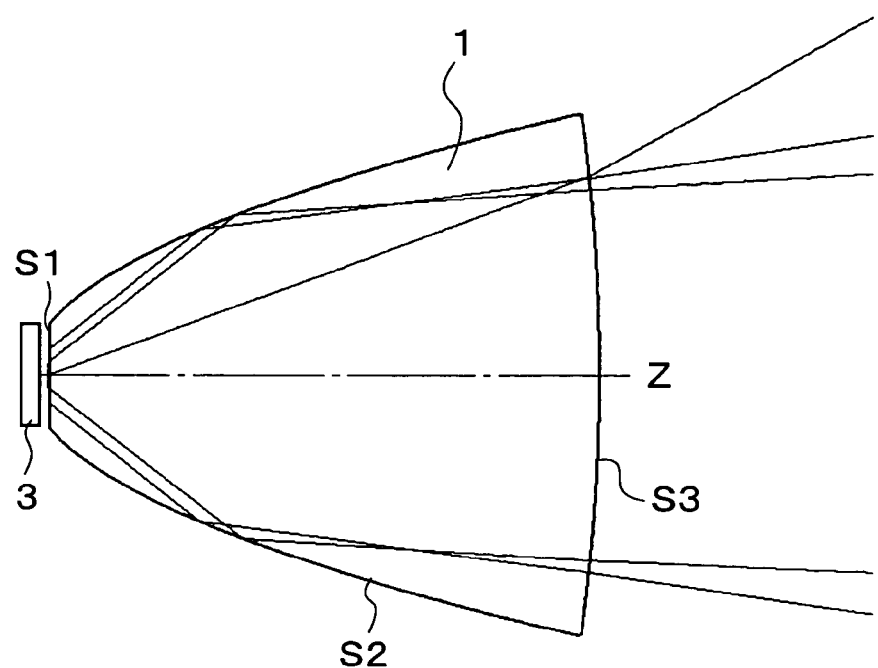
FIG. 20A is an optical path diagram, in cross section, of the optical element in Example 9.
Figure 20B:
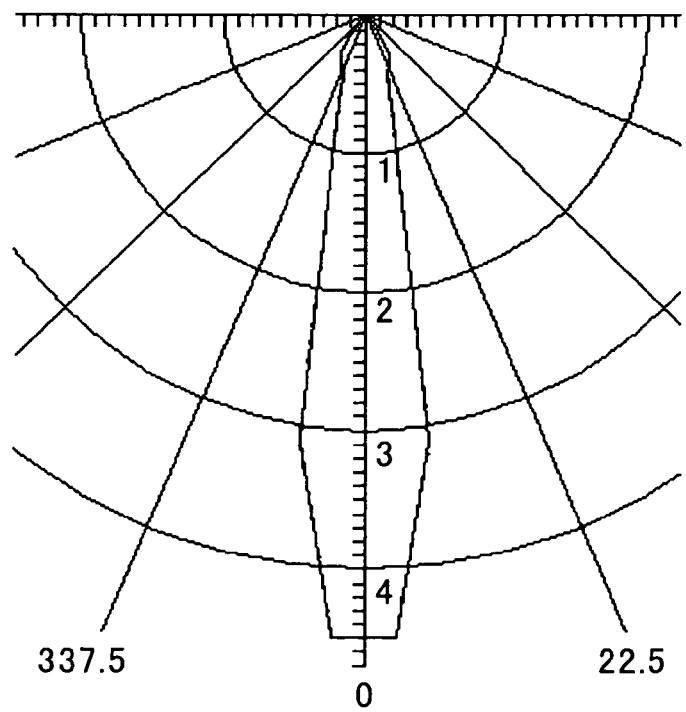
FIG. 20B is a directivity characteristic diagram for the optical element described above.
Figure 21A:
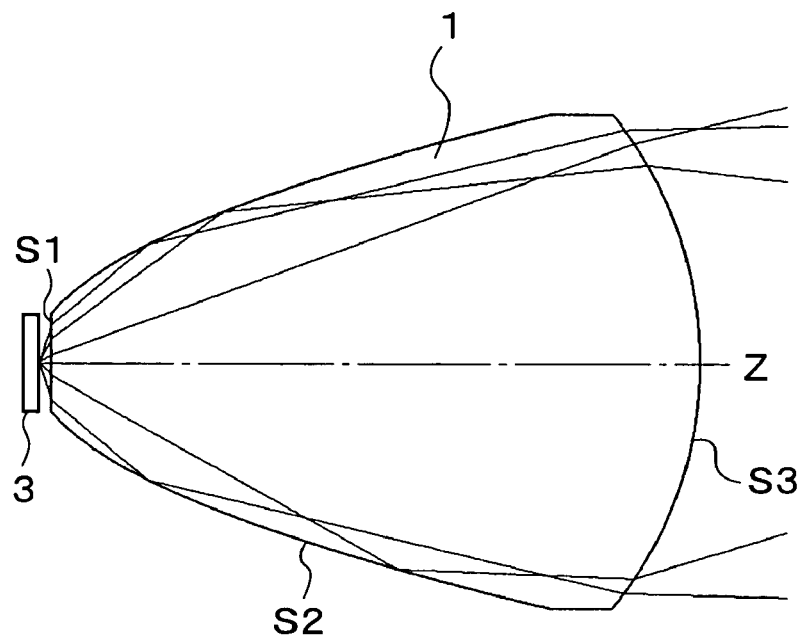
FIG. 21A is an optical path diagram, in cross section, of the optical element in Example 10.
Figure 21B:
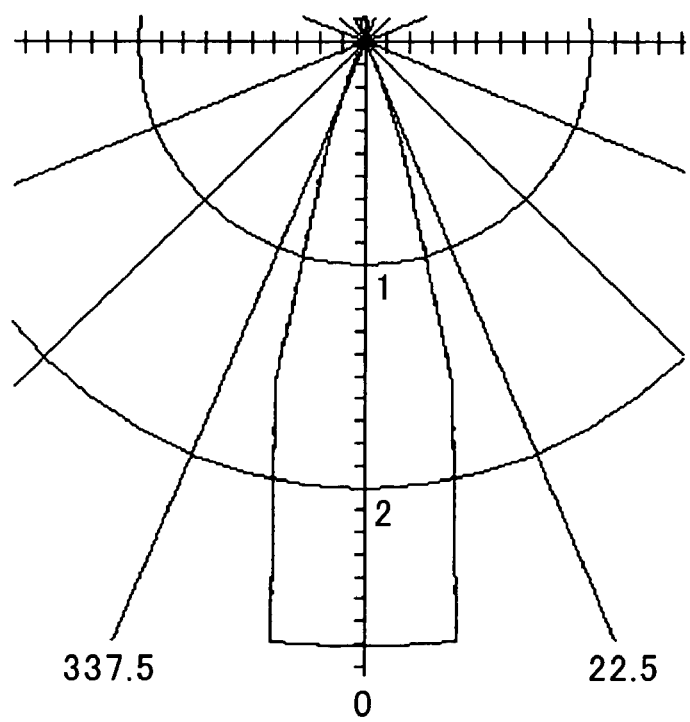
FIG. 21B is a directivity characteristic diagram for the optical element described above.
Figure 22A:
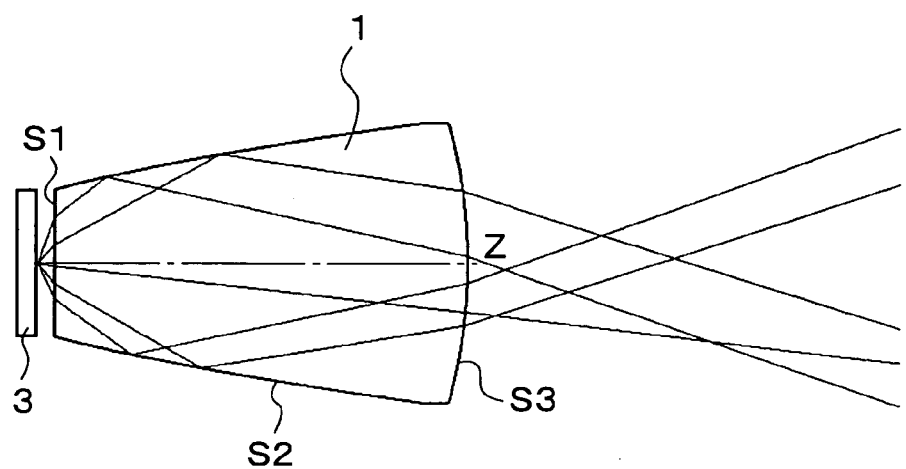
FIG. 22A is an optical path diagram, in cross section, of the optical element in Example 11.
Figure 22B:
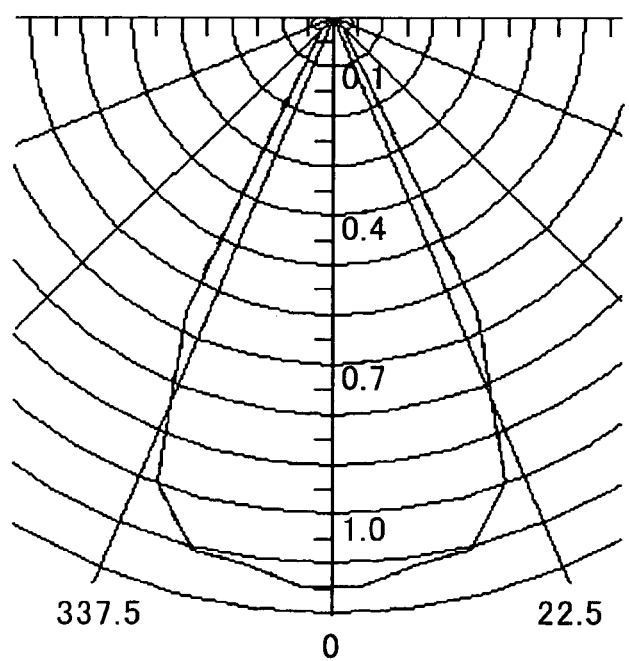
FIG. 22B is a directivity characteristic diagram for the optical element described above.
Figure 23A:
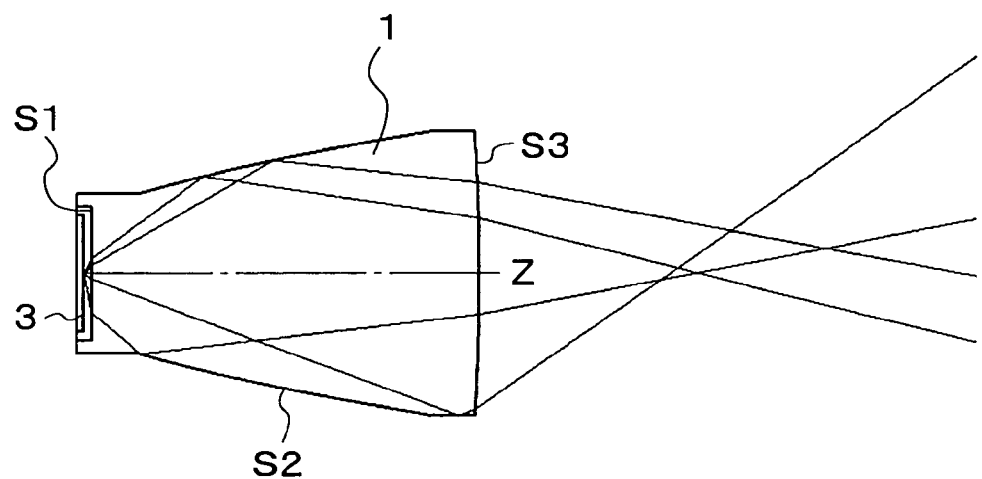
FIG. 23A is an optical path diagram, in cross section, of the optical element in Example 12.
Figure 23B:
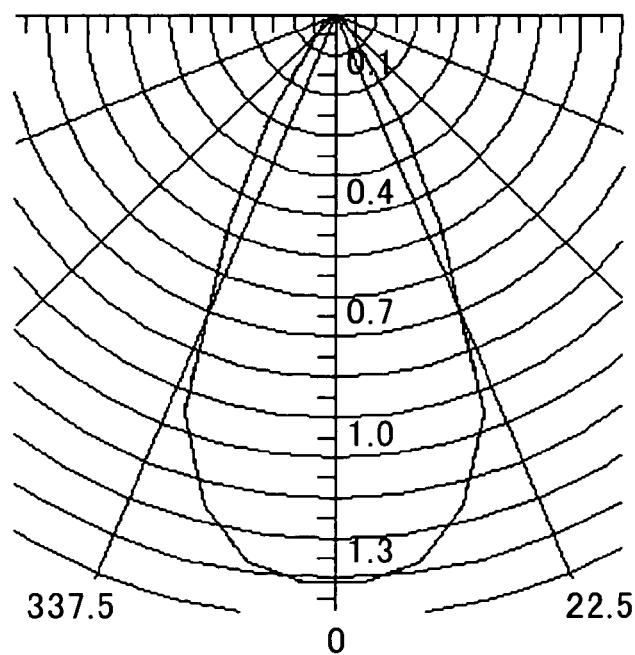
FIG. 23B is a directivity characteristic diagram for the optical element described above.
Figure 24:
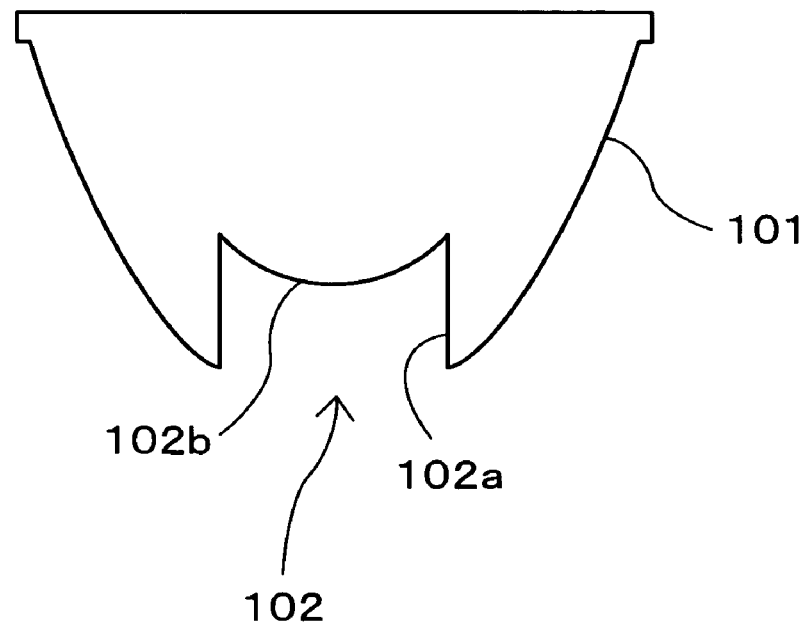
FIG. 24 is a sectional view showing the general configuration of a conventional optical element.

FIG. 16 is a perspective view showing the external view of the optical element 1 whose reflection surface (S2) has an axis of symmetry of sixfold rotation. The configuration and conditional formulae of this embodiment described above are also applicable to the optical element 1 shown in FIG. 16, and, even in this case, the same effect as is achieved in this embodiment can be provided. That is, the configuration and conditional formulae described in this embodiment is applicable to an optical element 1 whose reflection surface has an axis of symmetry of sixfold or higher-order-fold rotation.

Especially when the reflection surface has an axis of symmetry of n-fold or higher-order-fold rotation, forming the reflection surface into a shape (for example, paraboloid of revolution) which is rotationally symmetrical where n is infinite permits easy machining and manufacture of the optical element 1, thereby reducing the machining (manufacturing) costs. Therefore, it is preferable that a reflection surface be formed into a shape which is rotationally symmetrical where the n described above is infinite.

It is of course possible to combine the configuration and conditional formulae of the embodiments described above as appropriate to form an optical element 1.

Hereinafter, numerical value data of the optical elements according to the examples of this embodiment will be shown. In Examples 6 to 12 to be described below, the definition of each of parameters including Z, CR, k, and the like are completely identical to those of the first embodiment. Moreover, FIGS. 17A and 17B through FIGS. 23A and 23B are diagrams related to the optical elements 1 according to the Examples 6 to 12, respectively. FIGS. 17A, 18A, 19A, 20A, 21A, 22A, and 23A are optical path diagrams in cross section, and FIGS. 17B, 18B, 19B, 20B, 21B, 22B, and 23B are directivity characteristic diagrams.

EXAMPLE 6

Material: Polycarbonate
Refractive index (d-line): 1.5834
vd: 30.23

|  | [Z (mm)] | [CR (mm)] | [k] | [Effective diameter (mm)] |
|---|---|---|---|---|
| Light source (3) | 0 | INF | 0 | 10 |
| Entrance surface (S1) | 0.2 | INF | 0 | 10 |
| Reflection surface (S2) surface pex | 50.2 | 1.3125 | −1 | 20 |
| Exit surface (S3) surface apex | 66.2 | −50 | 0 | 20 |

EXAMPLE 7

Material: PMMA
Refractive index (d-line): 1.4914
vd: 57.82

|  | [Z (mm)] | [CR (mm)] | [k] | [Effective diameter (mm)] |
|---|---|---|---|---|
| Light source (3) | 0 | INF | 0 | 10 |
| Entrance surface (S1) | 0.2 | INF | 0 | 10 |
| Reflection surface (S2) surface apex | 50.2 | 8.75 | −1 | 60 |
| Exit surface (S3) surface apex | 61.2 | −50 | 0 | 60 |

EXAMPLE 8

Material: ZEONEX E48R
Refractive index (d-line): 1.5305
vd: 55.72

|  | [Z (mm)] | [CR (mm)] | [k] | [Effective diameter (mm)] |
|---|---|---|---|---|
| Light source (3) | 0 | INF | 0 | 10 |
| Entrance surface (S1) | 0.7 | INF | 0 | 10 |
| Reflection surface (S2) surface apex | 50.7 | 1.3125 | −1 | 25 |
| Exit surface (S3) surface apex | 52.7 | −100 | 0 | 25 |

EXAMPLE 9

Material: Polycarbonate
Refractive index (d-line): 1.5834
vd: 30.23

|  | [Z (mm)] | [CR (mm)] | [k] | [Effective diameter (mm)] |
|---|---|---|---|---|
| Light source (3) | 0 | INF | 0 | 10 |
| Entrance surface (S1) | 0.2 | INF | 0 | 10 |
| Reflection surface (S2) surface apex | 50.2 | 6 | −1 | 50 |
| Exit surface (S3) surface apex | 53.7 | −180 | 0 | 50 |

EXAMPLE 10

Material: PMMA
Refractive index (d-line): 1.4914
vd: 57.82

|  | [Z (mm)] | [CR (mm)] | [k] | [Effective diameter (mm)] |
|---|---|---|---|---|
| Light source (3) | 0 | INF | 0 | 10 |
| Entrance surface (S1) | 1.2 | INF | 0 | 10 |
| Reflection surface (S2) surface apex | 51.2 | 6 | −1 | 50 |
| Exit surface (S3) surface apex | 66.2 | −40 | 0 | 50 |

EXAMPLE 11

Material: ZEONEX E48R
Refractive index (d-line): 1.5305
vd: 55.72

|  | [Z (mm)] | [CR (mm)] | [k] | [Effective diameter (mm)] |
|---|---|---|---|---|
| Light source (3) | 0 | INF | 0 | 10 |
| Entrance surface (S1) | 1.2 | INF | 0 | 10 |

-continued

Material: ZEONEX E48R
Refractive index (d-line): 1.5305
vd: 55.72

|  | [Z (mm)] | [CR (mm)] | [k] | [Effective diameter (mm)] |
|---|---|---|---|---|
| Reflection surface (S2) surface apex | 26.2 | 1.3125 | −1 | 19 |
| Exit surface (S3) surface apex | 29.2 | −35 | 0 | 19 |

EXAMPLE 12

Material: ZEONEX E48R
Refractive index (d-line): 1.5305
vd: 55.72

|  | [Z (mm)] | [CR (mm)] | [k] | [Effective diameter (mm)] |
|---|---|---|---|---|
| Light source (3) | 0 | INF | 0 | 10 |
| Entrance surface (S1) | 0.2 | INF | 0 | 10.5 |
| Reflection surface (S2) surface apex | 26.7 | 1.875 | −1 | 22.3 |
| Exit surface (S3) surface apex | 30.2 | −180 | 0 | 22.3 |

Table. 2 shows values for the conditional formulae in the examples.

TABLE 2

|  | Example 6 | Example 7 | Example 8 | Example 9 | Example 10 | Example 11 | Example 12 |
|---|---|---|---|---|---|---|---|
| a/b | 0.5 | 1.2 | 0.48 | 0.943 | 0.769 | 0.679 | 0.74 |
| \|b/c\| | 1 | 1 | 0.52 | 0.294 | 1.625 | 0.8 | 0.17 |
| d/b | 0.003 | 0.003 | 0.013 | 0.004 | 0.018 | 0.042 | 0.007 |
| e/a | 0.4 | 0.16 | 0.4 | 0.2 | 0.2 | 0.526 | 0.47 |

Table. 3 show the 60 degrees efficiencies in the examples.

TABLE 3

|  | Example 6 | Example 7 | Example 8 | Example 9 | Example 10 | Example 11 | Example 12 |
|---|---|---|---|---|---|---|---|
| 60 degrees efficiency (%) | 95.33 | 94.81 | 85.68 | 79.56 | 73.632 | 74.547 | 79.5 |

As described above, the invention permits achieving highly efficient condensation at low costs and with simple configuration, and also permits compactification by reducing the diameter of the optical element with respect to the size of the light emitting surface.

The above description proves that various additions and modifications can be made for the invention. Therefore, it should be understood that the invention is implemented within the scope of the appended claims without being caught with the detailed description.

What is claimed is:
1. An optical element that condenses light emitted from a light source, including:
   an entrance surface where the light enters;
   an exit surface from which the light entering inside via the entrance surface exits; and
   a reflection surface that directs, to the exit surface by total reflection, part of the light entering the inside via the entrance surface,
   wherein the reflection surface has an axis of symmetry of sixfold or higher-order-fold rotation, and
   wherein conditional formula below is fulfilled:

$0.3 < a/b < 1.4$, where
   a denotes a maximum length of the exit surface in a direction perpendicular to the axis of symmetry; and
   b denotes a surface gap on the axis of symmetry between the entrance surface and the exit surface.
2. The optical element according to claim 1,
   arranged with an air gap provided between the optical element and the light source.
3. The optical element according to claim 1,
   wherein conditional formulae below is fulfilled, $0.15 < |b/c| < 1.8$, where
   c denotes a paraxial radius of curvature of the exit surface.
4. The optical element according to claim 1,
   wherein conditional formula below is fulfilled:

$0.001 < d/b < 0.20$, where
   d denotes a maximum value of distance from a light emitting surface of the light source to the entrance surface of the optical element.
5. The optical element according to claim 4,
   wherein conditional formula below is fulfilled:

$0.15 < |b/c| < 1.8$, where
   c denotes a paraxial radius of curvature of the exit surface.

6. The optical element according to claim 1,
wherein, on the entrance surface, a projection is formed which abuts a base where the light source is loaded, and
wherein the projection and the entrance surface form a concave portion for storing the light source.

7. The optical element according to claim 6,
wherein the projection includes a notch for permitting heat generated, upon abutting with the base, from the light source stored in the concave portion to escape to outside.

8. The optical element according to claim 1,
wherein conditional formula below is fulfilled:

$0.16 < e/a < 0.8$, where
e denotes a maximum length of the entrance surface in a direction perpendicular to the axis of symmetry.

9. The optical element according to claim 1,
wherein the reflection surface is so formed as to be rotationally symmetrical.

10. The optical element according to claim 9,
wherein conditional formula below is fulfilled:

$0.16 < e/a < 0.8$, where
e denotes a maximum length of the entrance surface in a direction perpendicular to the axis of symmetry.

11. An optical element that condenses in a predetermined direction light emitted from a light source having a widening surface form, the optical element including:
an entrance surface formed of a flat surface;
an exit surface from which light entering via the entrance surface exits, the exit surface being so formed as to be convexed on an exit side of the light; and
a reflection surface which directs, to the exit surface by total reflection, part of the light entering via the entrance surface, the reflection surface being so formed as to be convexed on an entrance side of the light,
wherein the light source is disposed near the entrance surface, and
wherein, after entering the entrance surface, light emitted from the light source is totally reflected by the convexed portion of the reflection surface, is further transmitted through the exit surface, and exits therefrom, or after entering the entrance surface, is directly transmitted through the exit surface and exits therefrom,
wherein conditional formula below is fulfilled:

$1.0 < r/(n-n')TL < 6.0$, where
r denotes a radius of curvature of the exit surface;
n denotes a refractive index of the optical element;
n' denotes a refractive index of a medium on the exit side; and
TL denotes a full length of the optical element.

12. The optical element according to claim 11,
wherein the reflection surface is an aspherical surface, which is so formed as to stress a convex shape more toward a periphery of an optical axis, and
wherein conditional formula below is fulfilled:

$-1.2 < k < -0.8$, where
k denotes a conic coefficient.

13. The optical element according to claim 11,
wherein the reflection surface is a paraboloidal surface.

14. The optical element according to claim 11,
wherein conditional formula below is fulfilled:

$1.8 < B/D < 6.0$, where
B denotes a maximum length of the exit surface in a direction perpendicular to an optical axis; and
D denotes a maximum diagonal length of the light source.

15. The optical element according to claim 11,
wherein, on the entrance surface, a step or a convex portion is provided for keeping constant distance from the light source, and
wherein conditional formula below is fulfilled:

$15 < D/L < 1000$, where
D denotes a maximum diagonal length of the light source; and
L denotes distance between the light source and the entrance surface.

16. The optical element according to claim 11,
wherein conditional formula below is fulfilled:

$0.9 < A/D < 3.0$, where
A denotes a maximum length of the entrance surface in a direction perpendicular to the optical axis, and
D denotes a maximum diagonal length of the light source.

17. The optical element according to claim 11,
wherein conditional formula below is fulfilled:

$1.0 < Z/(CR2/2) < 6.0$, where
CR2 denotes a radius of curvature of the reflection surface; and
Z denotes an absolute value of distance from a surface apex of the reflection surface to the light source.

18. The optical element according to claim 11,
formed of athermal resin.

19. A lighting device including: an optical element; and a light source that is arranged near an entrance surface of the optical element,
wherein the optical element includes: an entrance surface where light emitted from the light source enters, an exit surface from which the light entering inside via the entrance surface exits, and a reflection surface that directs, to the exit surface by total reflection, part of the light entering the inside via the entrance surface,
wherein the reflection surface has an axis of symmetry of six-fold or higher-order-fold rotation, and
wherein conditional formula below is fulfilled:

$0.3 < a/b < 1.4$, where
a denotes a maximum length of the exit surface in a direction perpendicular to the axis of symmetry; and
b denotes a surface gap on the axis of symmetry between the entrance surface and the exit surface.

20. The lighting device according to claim 19,
wherein, on the entrance surface of the optical element, a projection is provided which abuts a base where the light source is loaded, and
wherein the projection and the entrance surface form a concave portion for storing the light source.

* * * * *